United States Patent
Chou et al.

(10) Patent No.: US 12,279,444 B2
(45) Date of Patent: Apr. 15, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Yi-Lun Chou, Suzhou (CN); Kye Jin Lee, Suzhou (CN); Han-Chin Chiu, Suzhou (CN); Xiuhua Pan, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 824 days.

(21) Appl. No.: 17/380,041

(22) Filed: Jul. 20, 2021

(65) Prior Publication Data
US 2022/0328675 A1    Oct. 13, 2022

Related U.S. Application Data

(63) Continuation of application No. 17/420,718, filed as application No. PCT/CN2021/086526 on Apr. 12, 2021, now Pat. No. 12,148,713.

(51) Int. Cl.
*H10D 30/47* (2025.01)
*H01L 21/02* (2006.01)
(Continued)

(52) U.S. Cl.
CPC ..... *H10D 30/475* (2025.01); *H01L 21/02458* (2013.01); *H01L 21/02505* (2013.01);
(Continued)

(58) Field of Classification Search
CPC ........... H01L 29/2003; H01L 21/02458; H01L 21/02505; H01L 21/02507; H01L 21/0251;
(Continued)

(56) References Cited

U.S. PATENT DOCUMENTS

| 5,604,356 A | 2/1997 | Shiraishi |
| 8,536,615 B1 | 9/2013 | Driscoll et al. |

(Continued)

FOREIGN PATENT DOCUMENTS

| CN | 103367421 | 10/2013 |
| CN | 103403840 A | 11/2013 |

(Continued)

OTHER PUBLICATIONS

United States Patent and Trademark Office, non-final office action, Office Action Issued in U.S. Appl. No. 17/384,832, filed Sep. 6, 2023, 21 pages.

(Continued)

*Primary Examiner* — Britt D Hanley
*Assistant Examiner* — Victor V Barzykin
(74) *Attorney, Agent, or Firm* — JCIPRNET

(57) ABSTRACT

A semiconductor device includes a nucleation layer, a buffer layer, a first nitride-based semiconductor layer, a second nitride-based semiconductor layer, S/D electrodes, and a gate electrode. The nucleation layer includes a composition that includes a first element. The buffer layer includes a III-V compound which includes the first element. The buffer layer has a concentration of the first element oscillating within the buffer layer, such that the concentration of the first element varies as an oscillating function of a distance within a thickness of the buffer layer. A first oscillation rate between a first reference point and a second reference point within the buffer layer is greater than a second oscillation rate between the second reference point and a third reference point within the buffer layer. The first and second nitride-based semiconductor layer, S/D electrodes, and a gate electrode are disposed on the buffer layer.

20 Claims, 22 Drawing Sheets

(51) Int. Cl.
*H10D 62/17* (2025.01)
*H10D 62/85* (2025.01)

(52) U.S. Cl.
CPC .... *H01L 21/02507* (2013.01); *H01L 21/0251* (2013.01); *H01L 21/0254* (2013.01); *H10D 62/357* (2025.01); *H10D 62/8503* (2025.01); *H10D 62/343* (2025.01)

(58) Field of Classification Search
CPC ............. H01L 21/0254; H01L 29/1075; H01L 29/1066; H01L 29/7786; H01L 29/205; H01L 29/66462; H01L 29/207; H10D 62/343; H10D 62/357; H10D 62/8503; H10D 30/475
See application file for complete search history.

(56) References Cited

U.S. PATENT DOCUMENTS

| | | | |
|---|---|---|---|
| 8,963,164 | B2 | 2/2015 | Shimizu et al. |
| 9,276,066 | B2 | 3/2016 | Tamura et al. |
| 9,508,822 | B2 | 11/2016 | Oka et al. |
| 9,608,075 | B1 | 3/2017 | Wan et al. |
| 9,653,589 | B2 | 5/2017 | Umeno et al. |
| 9,923,061 | B2 | 3/2018 | Bavard et al. |
| 10,186,421 | B2 | 1/2019 | Fukazawa et al. |
| 10,332,876 | B2 | 6/2019 | Siemieniec et al. |
| 11,581,269 | B2 | 2/2023 | Park et al. |
| 11,869,942 | B2 | 1/2024 | Thapa et al. |
| 2005/0110043 | A1 | 5/2005 | Otsuka et al. |
| 2010/0244096 | A1 | 9/2010 | Sato |
| 2011/0272665 | A1* | 11/2011 | Yamaguchi ......... H01L 21/0254 257/E29.074 |
| 2011/0297961 | A1 | 12/2011 | Bunin et al. |
| 2013/0307023 | A1 | 11/2013 | Kokawa et al. |
| 2014/0061665 | A1 | 3/2014 | Tsuchiya |
| 2014/0091318 | A1 | 4/2014 | Ishiguro et al. |
| 2015/0076449 | A1 | 3/2015 | Yamada |
| 2015/0372124 | A1 | 12/2015 | Isobe et al. |
| 2016/0072386 | A1 | 3/2016 | Saito |
| 2017/0033210 | A1 | 2/2017 | Curatola et al. |
| 2018/0097072 | A1 | 4/2018 | Briere |
| 2018/0323265 | A1 | 11/2018 | Liu et al. |
| 2018/0374941 | A1 | 12/2018 | Park et al. |
| 2019/0221648 | A1* | 7/2019 | Liu ...................... H01L 29/205 |
| 2019/0348411 | A1 | 11/2019 | Chen et al. |
| 2020/0303531 | A1 | 9/2020 | Park et al. |
| 2021/0126118 | A1 | 4/2021 | Baines et al. |
| 2021/0151591 | A1 | 5/2021 | Chen et al. |
| 2022/0328672 | A1 | 10/2022 | Chou et al. |
| 2022/0328675 | A1 | 10/2022 | Chou et al. |
| 2022/0328677 | A1 | 10/2022 | Chou et al. |
| 2022/0328678 | A1 | 10/2022 | Chou et al. |
| 2023/0072850 | A1 | 3/2023 | Chou et al. |
| 2023/0290873 | A1 | 9/2023 | Lin et al. |

FOREIGN PATENT DOCUMENTS

| | | |
|---|---|---|
| CN | 104465743 | 3/2015 |
| CN | 105229207 A | 1/2016 |
| CN | 109103099 | 12/2018 |
| CN | 111490100 | 8/2020 |
| JP | 2011023642 A | 2/2011 |
| JP | 2015035535 A | 2/2015 |
| WO | 2010044978 | 4/2010 |
| WO | 2020155096 A1 | 8/2020 |

OTHER PUBLICATIONS

United States Patent and Trademark Office, non-final office action, Office Action Issued in U.S. Appl. No. 17/384,839, filed Oct. 16, 2023, 20 pages.
United States Patent and Trademark Office, non-final office action, Office Action Issued in U.S. Appl. No. 17/420,717, filed Oct. 30, 2023, 28 pages.
United States Patent and Trademark Office, non-final office action, Office Action Issued in U.S. Appl. No. 17/384,831, filed Nov. 16, 2023, 24 pages.
United States Patent and Trademark Office, non-final office action, Office Action Issued in U.S. Appl. No. 17/384,833, filed Nov. 16, 2023, 23 pages.
International Search Report and Written Opinion of the corresponding PCT application No. PCT/CN2021/086526 mailed on Jan. 17, 2022.
United States Patent and Trademark Office, final office action Issued in U.S. Appl. No. 17/384,831, Feb. 14, 2024, 21 pages.
United States Patent and Trademark Office, final office action Issued in U.S. Appl. No. 17/420,717, filed Feb. 9, 2024, 18 pages.
United States Patent and Trademark Office, Requirement Restriction Issued in U.S. Appl. No. 17/380,044, filed Jan. 22, 2024, 6 pages.
United States Patent and Trademark Office, non-final office action Issued in U.S. Appl. No. 17/384,835, filed Dec. 8, 2023, 27 pages.
United States Patent and Trademark Office, non-final office action Issued in U.S. Appl. No. 17/384,838, filed Dec. 11, 2023, 27 pages.
United States Patent and Trademark Office, final office action Issued in U.S. Appl. No. 17/384,837, filed Jan. 9, 2024, 20 pages.
United States Patent and Trademark Office, non-final office action Issued in U.S. Appl. No. 17/420,718, filed Jan. 3, 2024, 31 pages.
"International Search Report (Form PCT/ISA/210) of PCT/CN2021/086528," mailed on Jan. 14, 2022, pp. 1-3.
"Written Opinion of the International Searching Authority (Form PCT/ISA/237) of PCT/CN2021/086528," mailed on Jan. 14, 2022, pp. 1-4.
"International Search Report (Form PCT/ISA/210) of PCT/CN2022/086198," mailed on Jul. 7, 2022, pp. 1-4.
"Written Opinion of the International Searching Authority (Form PCT/ISA/237) of PCT/ CN2022/086198," mailed on Jul. 7, 2022, pp. 1-5.
"Office Action of U.S. Related Application, U.S. Appl. No. 17/384,832", issued on Jun. 15, 2023, p. 1-p. 8.
"Office Action of U.S. Related Application, U.S. Appl. No. 17/384,837", issued on Jul. 13, 2023, p. 1-p. 27.
Office Action of China Related Application, Application No. 202180005980.2, with English translation thereof, issued on Nov. 30, 2022, pp. 1-19.
United States Patent and Trademark Office, final office action issued in U.S. Appl. No. 17/380,044, filed Nov. 6, 2024, 14 pages.
United States Patent and Trademark Office, Second final office action issued in U.S. Appl. No. 17/384,831, Sep. 11, 2024, 18 pages.
United States Patent and Trademark Office, Second Advisory Action issued in U.S. Appl. No. 17/384,831, filed Nov. 19, 2024, 5 pages.
United States Patent and Trademark Office, Second final office action issued in U.S. Appl. No. 17/420,717, filed Sep. 11, 2024, 19 pages.

\* cited by examiner

SEMICONDUCTOR DEVICE AND METHOD FOR MANUFACTURING THE SAME

CROSS-REFERENCES TO RELATED APPLICATIONS

This application is a continuation application of U.S. application Ser. No. 17/420,718, filed on Jul. 6, 2021, which is a national phase application of PCT/CN2021/086526 filed on Apr. 12, 2021, the disclosure of which are incorporated herein by reference in their entirety.

FIELD OF THE INVENTION

The present invention generally relates to a semiconductor device. More specifically, the present invention relates to a high electron mobility transistor (HEMT) semiconductor device having a buffer layer with an oscillatory concentration of group III element.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a semiconductor device includes a substrate, a nucleation layer, a buffer layer, a first nitride-based semiconductor layer, a second nitride-based semiconductor layer, source/drain (S/D) electrodes, and a gate electrode. The nucleation layer includes a composition that includes a first element and is disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. Spacings among adjacent peaks of the oscillating function change from wide to narrow with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, source/drain (S/D) electrodes, and a gate electrode. The nucleation layer includes a composition that includes a first element and is disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. Spacings among adjacent peaks of the oscillating function change from narrow to wide with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, source/drain (S/D) electrodes, and a gate electrode. The nucleation layer includes a composition that includes a first element and is disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. A first oscillation rate between a first reference point and a second reference point within the buffer layer is greater than a second oscillation rate between the second reference point and a third reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, source/drain (S/D) electrodes, and a gate electrode. The nucleation layer includes a composition that includes a first element and is disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. A first oscillation rate between a first reference point and a second reference point within the buffer layer is less than a second oscillation rate between the second reference point and a third reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, source/drain (S/D) electrodes, and a gate electrode. The nucleation layer includes a composition that includes a first element and is disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. An oscillation rate in the concentration of the first element per unit thickness of the buffer layer varies with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

By applying the above configuration, the variable concentration of aluminum has the decremental decreases and the incremental increases, such that the trend of the variable concentration of aluminum can reverse, which would turn the trend of the curvature of the buffer layer. The curvature can be avoided to become very positive or negative. Moreover, the oscillation rate can be adjusted such that the formation of the buffer layer can comply with the layer design. Accordingly, the yield rate for the semiconductor device during the process for manufacturing the same is improved.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
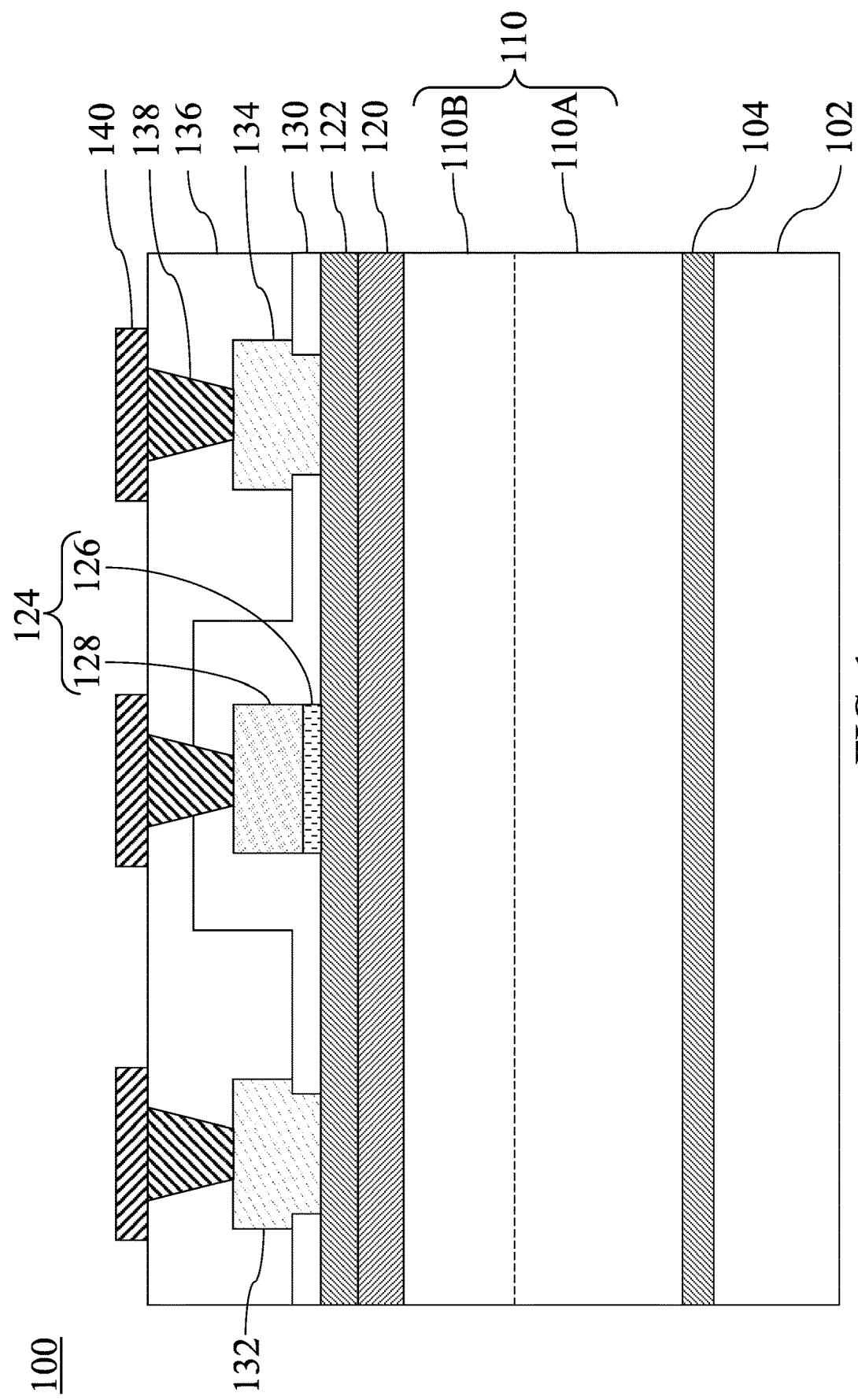
FIG. 1 is a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices/ semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a cross-sectional view of a semiconductor device 100 according to some embodiments of the present disclosure. The semiconductor device 100 includes a substrate 102, a nucleation layer 104, a buffer layer 110, nitride-based semiconductor layers 120 and 122, a gate structure 124, a passivation layer 130, a pair of source/drain (S/D) electrodes 132 and 134, a passivation layer 136, vias 138, and a patterned conductive layer 140.

The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example but are not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxy (epi) layer, or combinations thereof.

The nucleation layer 104 is formed on the substrate 102. The nucleation layer 104 may form an interface with the substrate 102. The nucleation layer 104 is configured to provide a top surface for growth of III-nitride material thereon. In other words, the nucleation layer 104 forms an appropriate template to transition from lattice of the substrate to a template more suitable for growth of III-nitride material. The nucleation layer 104 can provide a transition to accommodate a mismatch/difference between the substrate 102 and a III-nitride layer to be formed on the top surface thereof (e.g. epitaxially formation). The mismatch/ difference may refer to different lattice constants or thermal expansion coefficients. The mismatch/difference might cause dislocation in the formed layer and thus the yield rate is reduced. The exemplary material of the nucleation layer 104 can include, for example but is not limited to AlN or any of its alloys. The AlN may be, for example, but is not limited to doped n-type, p-type, or intrinsic. The material(s) of the nucleation layer can be selected to cur the mismatch/difference. For example, in order to accommodate a mismatch/ difference due to a first element in a layer to be formed on the nucleation layer, the nucleation layer 104 is formed with including the first element.

The buffer layer 110 is formed on the nucleation layer 104. The buffer layer 110 may form an interface with the nucleation layer 104. The buffer layer 110 has a bottom-most surface in contact with the nucleation layer 104. The interface is formed by the bottom-most surface of the buffer layer 110 and a top-most surface of the nucleation layer 104. The buffer layer 110 has a top-most surface opposite the bottom-most surface. The buffer layer 110 is configured to reduce lattice and thermal mismatches between the underlying layer and a layer to be formed on the buffer layer 110 (e.g. epitaxially formed thereon), thereby curing defects due to the mismatches/difference.

The buffer layer 110 includes a III-V compound. The III-V compound can include, for example but are not limited to, aluminum, gallium, indium, nitride, or combinations thereof. Accordingly, the exemplary materials of the buffer layer 110 can further include, for example but are not limited to, AlN, AlGaN, InAlGaN, or combinations thereof. In some embodiments, the buffer layer 110 may include two kinds of group III elements, and the nucleation layer only has one kind of the group III elements. For example, the nucleation layer includes a compound which includes aluminum and is devoid of gallium (e.g. AlN), and the buffer layer 110 includes a III-V compound which includes aluminum and gallium (e.g. AlGaN).

The nitride-based semiconductor layer 120 is disposed over the buffer layer 110. The exemplary materials of the nitride-based semiconductor layer 120 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The nitride-based semiconductor layer 122 is disposed on the nitride-based semiconductor layer 120. The exemplary materials of the nitride-based semiconductor layer 122 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 120 and 122 are selected such that the nitride-based semiconductor layer 122 has a bandgap (i.e. forbidden band width) greater than a bandgap of the nitride-based semiconductor layer 120, which causes electron affinities thereof different from each other and forms a heterojunction therebetween. For example, when the nitride-based semiconductor layer 120 is an undoped GaN layer having bandgap of approximately 3.4 eV, the nitride-based semiconductor layer 122 may be an AlGaN layer having bandgap of approximately 4.0 eV. As such, the nitride-based semiconductor layers 120 and 122 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 100 can include at least one GaN-based high-electron-mobility transistor (HEMT).

In a case that the nitride-based semiconductor layer 120 is devoid of aluminum, the buffer layer 110 including aluminum gallium nitride (AlGaN) is formed to reduce lattice and thermal mismatches between the underlying layer (e.g. the substrate 102) and the nitride-based semiconductor layer 120. For the purpose of reducing lattice and thermal mismatches, as the nitride-based semiconductor layer 120 includes gallium nitride (GaN) and the nitride-based semiconductor layer 122 includes aluminum gallium nitride (AlGaN), the nucleation layer 104 and the buffer layer can be selected to include aluminum nitride (AlN) and aluminum gallium nitride (AlGaN), respectively. To illustrate, the buffer layer 110 of the present embodiment includes aluminum gallium nitride (AlGaN), and it is for the exemplary purpose and the present disclosure is not limited thereto.

Although a buffer layer can be formed to cure defects as stated above, over-accumulated stresses during the growth of a buffer layer may affect a layer to be formed on the buffer layer. Over-accumulated stresses will affect a yield rate of a semiconductor device.

In this regard, the buffer layer 110 can have a variable concentration of a group III element to solve such issues. One of the reasons to design the concentration of the group III element as being variable is to prevent the buffer layer 110 or a layer formed on the buffer layer 110 (e.g. the nitride-based semiconductor layer 120) from bending due to over-accumulated stress. For example, as the buffer layer 110 includes AlGaN, the buffer layer 110 may have a variable concentration of aluminum. Herein, the variable concentration may refer to include both an increasing trend and a decreasing trend in the concentration. The variable concentration may increase and then decrease. The variable concentration may decrease and then increase. The increase may include an incremental increase. The decrease may include a decremental decrease. The incremental increase and decremental decrease can result in oscillation in the concentration of aluminum. In some embodiments, the oscillation rate is adjustable and controllable, so as to fit the desire thickness of the buffer layer 110.

Figure 2A:
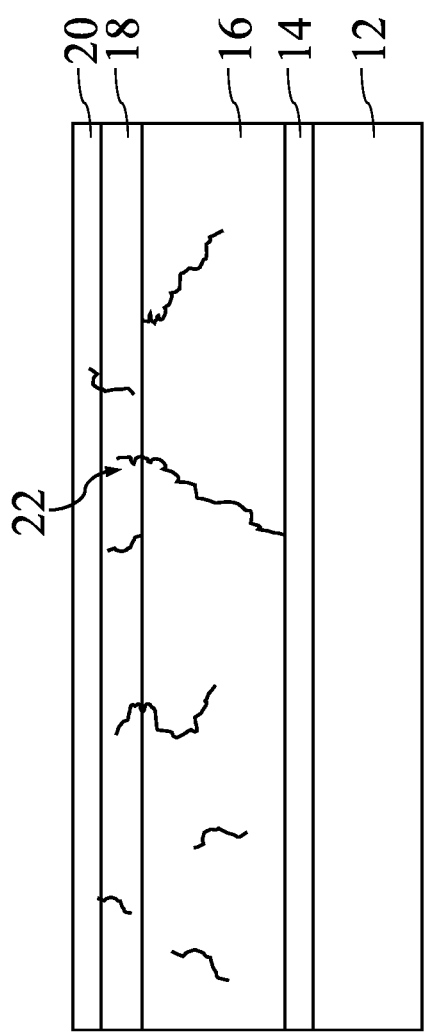
FIG. 2A is a cross-section view schematically showing a manufacturing stage for a semiconductor device according to a comparative embodiment.
Figure 2B:
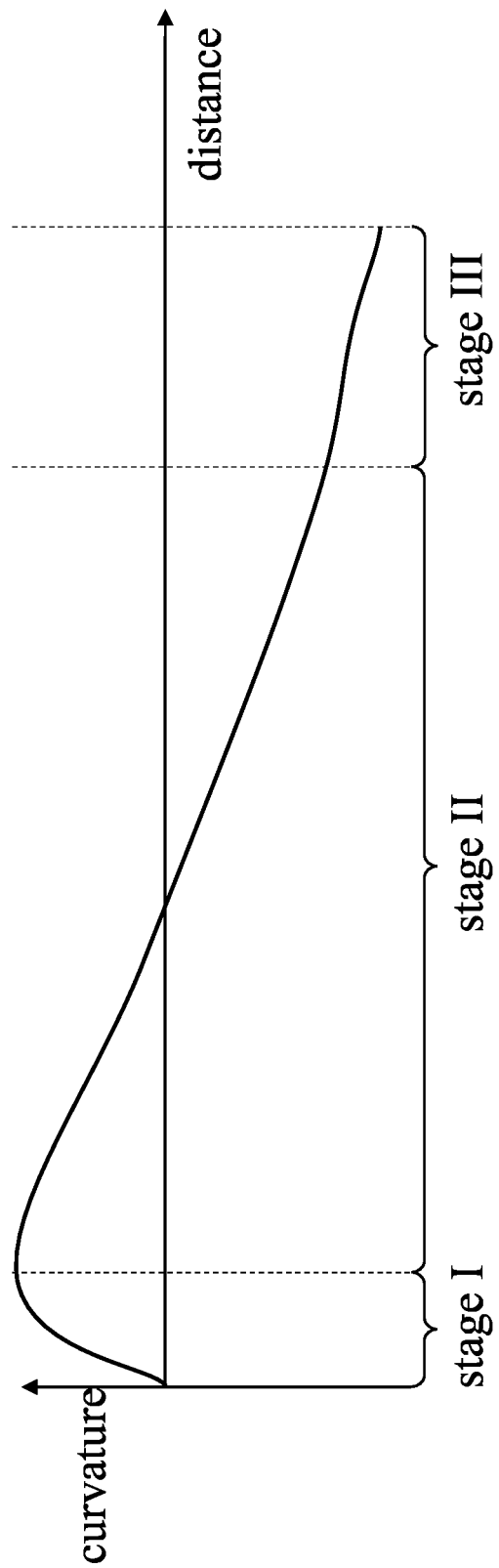
FIG. 2B is a graph showing curvature versus a distance within a thickness of a buffer layer of the semiconductor device of FIG. 2A.

To demonstrate how a concentration can affect a yield rate, FIG. 2A is a cross-section view schematically showing a manufacturing stage for a semiconductor device 10 according to a comparative embodiment, and FIG. 2B is a graph showing curvature versus a distance within a thickness of a buffer layer of the semiconductor device 10 of FIG. 2A. As shown in FIG. 2A, an nucleation layer 14, a buffer layer 16, and nitride-based semiconductor layers 18 and 20 are formed on a substrate 12 in sequence. In the comparative embodiment, the nucleation layer 14 is made of aluminum nitride (AlN), the buffer layer is made of aluminum gallium nitride (AlGaN), the nitride-based semiconductor layer 18 is made of gallium nitride (GaN), and the nitride-based semiconductor layer 20 is made of aluminum gallium nitride (AlGaN).

The distance of FIG. 2B can refer to a distance from a top surface of the substrate 102. As shown in FIG. 2B, there are three stages I, II, and III, in which the stage I is the formation of the nucleation layer 14; the stage II is the formation of the buffer layer 16; and the stage III is the formation of the nitride-based semiconductor layer 18.

In the stage I, with the growth of the nucleation layer 14, the curvature increases due to accumulation of stress during the formation. In the stage II, the buffer layer 16 is formed for curing the aforementioned mismatches/difference. Accordingly, an aluminum concentration of the buffer layer 16 gradually decreases without increase as the growth of buffer layer 16 goes. The gradual decrease of the aluminum concentration is made for matching the properties of the nitride-based semiconductor layer 18 to be formed thereon. It is found that the trend of the aluminum concentration correlates with that of the curvature. That is, as the aluminum concentration continuously decreases, the curvature goes to the single direction. Accordingly, at the end of the formation of the buffer layer 16, the degree of the curvature is large (e.g. very positive curvature or very negative curvature). Thereafter, in the stage III, as growth of the nitride-based semiconductor layer 18, the curvature continuously develops along the single direction. Eventually, such degree of the curvature will result in warpage in the formed layer. For example, once the warpage occurs at the nitride-based semiconductor layer 18, cracks or voids 22 may appear in the same, which reduces quality of the nitride-based semiconductor layer 18 and reduces the yield rate of the final product as well. Therefore, the curvature issue resulted from the growth of the buffer layer exists in the manufacturing process. In the exemplary illustration of FIG. 2A, the cracks or voids 22 can result from lattice mismatch or coefficient of thermal expansion (CTE) mismatch. For the lattice mismatch, the cracks or voids 22 may start from an interface between two layers (e.g. being from an interface between the substrate 13 and the nucleation layer 14). For the CTE mismatch, the cracks or voids 22 may appear at any position within an epitaxy layer, such as the buffer layer 16, the nitride-based semiconductor layer 18 or 20. However, the appearance location of the cracks or voids 22 depends on the process condition in the practical situations.

The variable concentration of the group III element in the buffer layer 110 of FIG. 1 would reduce the curvature in the buffer layer 110 during the formation thereof, so as to avoid the nitride-based semiconductor layers 120 and 122 having cracks or voids.

Figure 3:
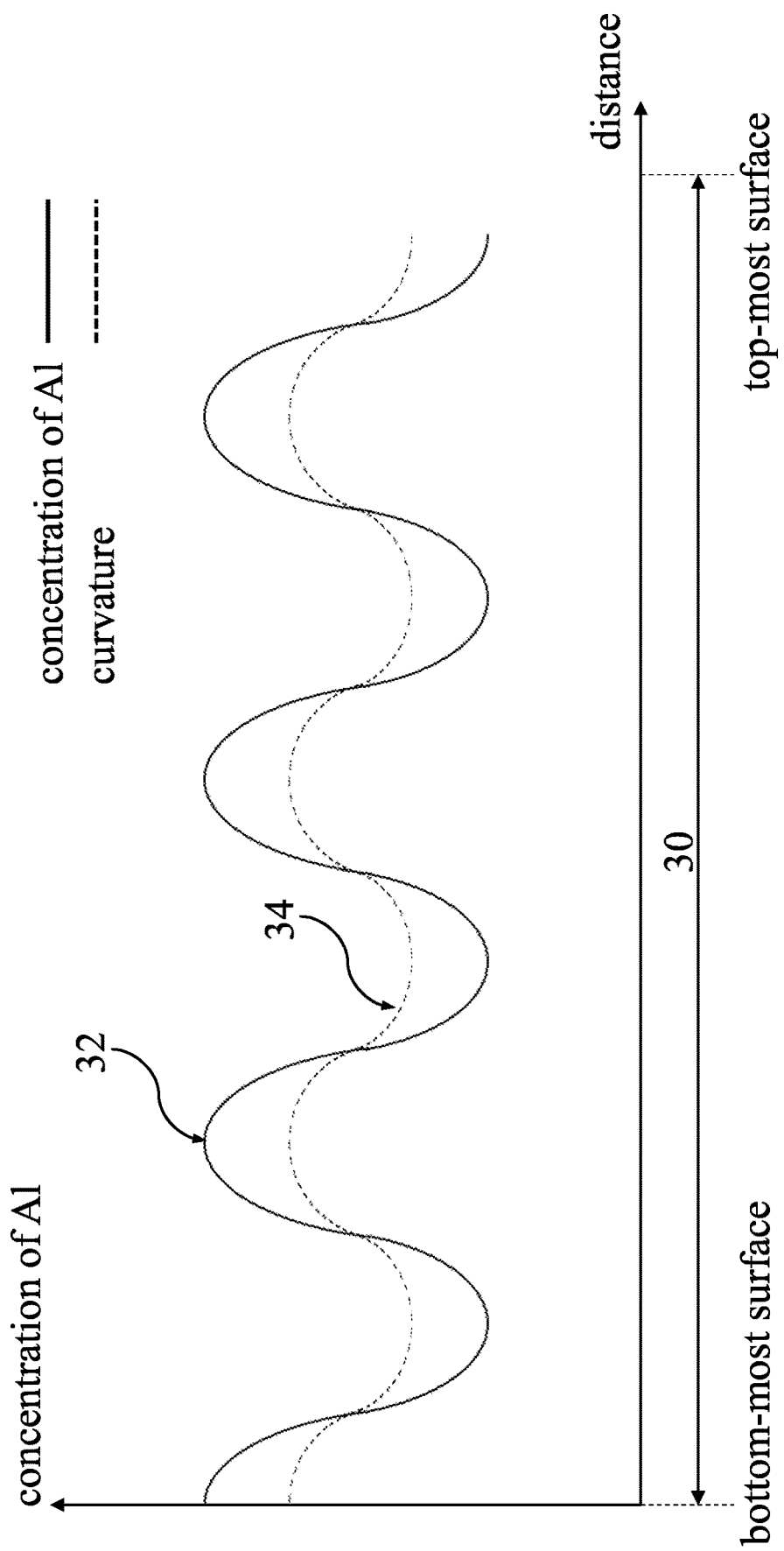
FIG. 3 is a graph showing a variable concentration of aluminum in a buffer layer versus a distance within a thickness of the same according to some embodiments of the present disclosure.

The reason of to avoid a nitride-based semiconductor having cracks or voids by a buffer layer having a variable concentration of a group III element can explained on FIG. 3, which is a graph showing a variable concentration of aluminum in a buffer layer 30 versus a distance within a thickness of the same according to some embodiments of the present disclosure. In FIG. 3, a bottom-most surface and a top-most surface of the buffer layer 30 are labeled on the corresponding locations at the X-axis for convenient reference. The distance at the X-axis can refer to a distance from the bottom-most surface to the top-most surface of the buffer layer 30, and is in an arbitrary unit. The Y-axis represents the value of the concentration of aluminum in the buffer layer 30, where the unit is "%."

The graph of FIG. 3 reflects a relationship curve 32 for the variable concentration of aluminum. As shown in FIG. 3, the term "variable concentration of aluminum" can be defined as that the concentration of aluminum varies as an oscillating function of a distance within a thickness of the buffer layer 30. Regarding "the oscillating function", the buffer layer can include at least one incremental increase and at least one decremental decrease in the variable concentration of aluminum. Briefly, in the exemplary illustration of FIG. 3, from the bottom-most surface toward the top-most surface of the buffer layer 110, the variable concentration of aluminum decrementally decreases, incrementally increases, decrementally decreases, and incrementally increases in sequence.

Since there are more than one incremental increase and more than one decremental decrease, the relationship curve 32 representing the variable concentration of aluminum in the buffer layer 30 can have at least one part cyclically oscillating. This is, the measurement to the buffer layer 110 may show the variable concentration of aluminum has a cyclical oscillation feature. Herein, the term "cyclical oscillation" can mean the concentration of aluminum varies by alternatively increasing and decreasing in a range. The cyclical oscillation may include a regular variation or an irregular variation, which may be composed by at least one wave function. In some embodiments, the wave function can include, for example but are not limited to, sine wave, cosine wave, triangle wave, sawtooth wave, saw wave, step wave, and combinations thereof. In some embodiments, the relationship curve 32 can be an oscillating curve/a cyclical curve changing periodically (i.e., a periodic curve).

As afore-mentioned, the trend of the curvature depends on whether the variable concentration increases or decreases. With the concentration of aluminum varying as "decrementally decreasing and then incrementally increasing" and "incrementally increasing and then decrementally decreasing", the curvature would be in variation correspondingly.

The graph of FIG. 3 reflects a relationship curve 34 for the curvature of the buffer layer 30. It should be noted that the curvature shown in FIG. 3 is exemplary and schematically reflects the trend of the curvature, and the absolute intensity may be varied due to the differences in the practical conditions (e.g., process conditions, measurement condition, or detection conditions).

Because the buffer layer 30 having the variable concentration of aluminum is formed, the variable concentration of aluminum can push the curvature in variation. More specifically, at the beginning of the growth of the buffer layer 30, since the concentration of aluminum decrementally decreases, the curvature changes as being in a negative trend. That is, the curvature may go from a positive state to a negative state. It may occur due to change of bending. Then, the concentration of aluminum is turned to incrementally increase, such that the trend of the curvature is turned as being positive. Such turning can make the curvature reduced. That is, with turning the trend of the curvature, it avoids that the negative curvature further becomes very negative. As the curvature is reduced, a layer to be formed on the buffer layer 30 (e.g., a nitride-based semiconductor layer) can have quality improved. It means the curvature can be controllable in a desired range. Herein, the desired range may refer to as being neither very positive nor very negative.

At the end of the relationship curve 32, it will be decreased to zero or approach to zero, so as to continue forming of a layer to be disposed on the buffer layer 30 (e.g., a nitride-based semiconductor layer without aluminum).

Figure 4:
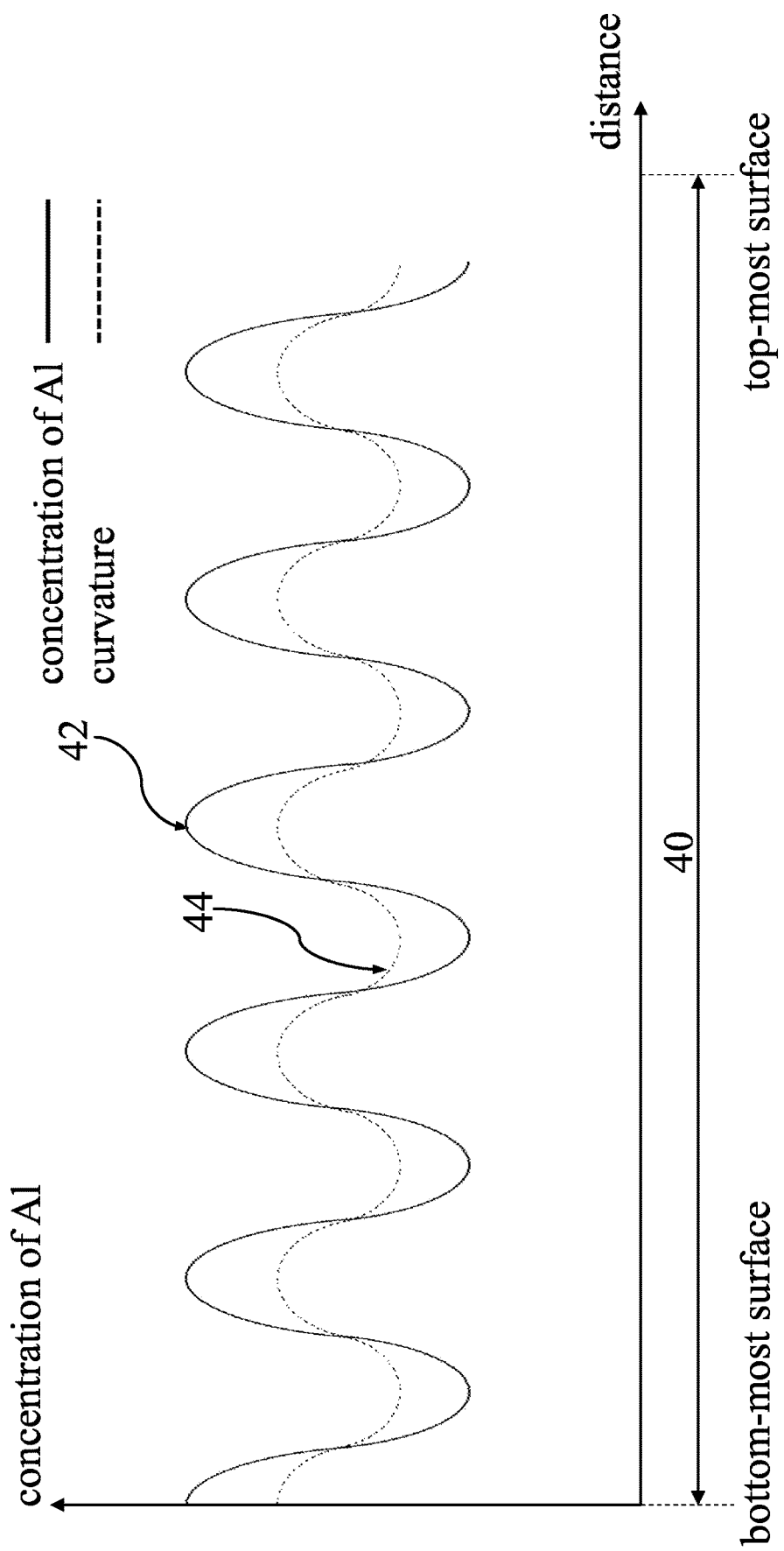
FIG. 4 is a graph showing a variable concentration of aluminum in a buffer layer versus a distance within a thickness of the same according to some embodiments of the present disclosure.

FIG. 4 is a graph showing a variable concentration of aluminum in a buffer layer 40 versus a distance within a thickness of the same according to some embodiments of the present disclosure. In FIG. 4, a bottom-most surface and a top-most surface of the buffer layer 40 are labeled on the corresponding locations at the X-axis for convenient reference. The distance at the X-axis can refer to a distance from the bottom-most surface to the top-most surface of the buffer layer 30, and is in an arbitrary unit. The Y-axis represents the value of the concentration of aluminum in the buffer layer 40, where the unit is "%."

The graph of FIG. 4 reflects a relationship curve 42 for the variable concentration of aluminum. The relationship curve 42 of FIG. 4 is similar with the relationship curve 32 of FIG. 3. In this regard, the relationship curve 42 of FIG. 4 has spacings among adjacent peaks of the oscillating function which are narrower than that of the relationship curve 32 of FIG. 3. That is, the relationship curve 42 of FIG. 4 can have more cycles than that of relationship curve 32 of FIG. 3 under a condition that the buffer layers 30 and 40 have the same thickness. Accordingly, the graph of FIG. 4 reflects a relationship curve 44 for the curvature of the buffer layer 40 and the relationship curve 44 can have more cycles than that of relationship curve 34 of FIG. 3.

In the present disclosure, the difference between FIGS. 3 and 4 can be defined as that the buffer layer 30 is formed with lower oscillation rate of aluminum than that of the buffer layer 40. More specifically, the buffer layers 30 and 40 have different oscillation rates in the concentration of aluminum per unit thickness.

In order to ease the complexity of the explanation in the present disclosure, high and low oscillation rates will be used in the following description, so as to state the oscillating concentrations as shown in FIGS. 3 and 4.

A buffer layer having such concentration of aluminum can be formed by using deposition techniques. The deposition techniques can include, for example but are not limited to, atomic layer deposition (ALD), physical vapor deposition (PVD), chemical vapor deposition (CVD), metal organic CVD (MOCVD), epitaxial growth, or other suitable processes.

During a deposition process for the formation of the buffer layer including aluminum gallium nitride (AlGaN), aluminum, gallium, and nitrogen precursors are introduced into a gas flow in a chamber. An aluminum ratio (i.e., a ratio of the aluminum precursor to all precursors) correlates with an aluminum concentration of the formed buffer layer. Accordingly, with gradually changing the aluminum ratio during the growth of the buffer layer, the buffer layer would be formed to have a variable concentration of aluminum. For example, by decreasing the aluminum ratio over time during the growth of the buffer layer, the buffer layer would be formed to have concentration of aluminum that decrementally decreases.

In some embodiments, decreasing the aluminum ratio can be achieved by decreasing quantity of the aluminum precursor. In some embodiments, decreasing the aluminum ratio can be achieved by increasing quantity of the gallium precursor. In some embodiments, decreasing the aluminum ratio can be achieved by increasing a gallium ratio (i.e., a ratio of the gallium precursor to all precursors). In some embodiments, decreasing the aluminum ratio can be achieved by decreasing a ratio of aluminum to gallium. Similarly, by increasing the aluminum ratio over time during the growth of the buffer layer, the buffer layer would be formed to have concentration of aluminum that incrementally increases. The decreasing/increasing the aluminum ratio per unit time correlates with the oscillation rate in the concentration of aluminum. For example, the faster decreasing/increasing the aluminum ratio per unit time is, the higher oscillation rate in the concentration of aluminum is.

Figure 5:
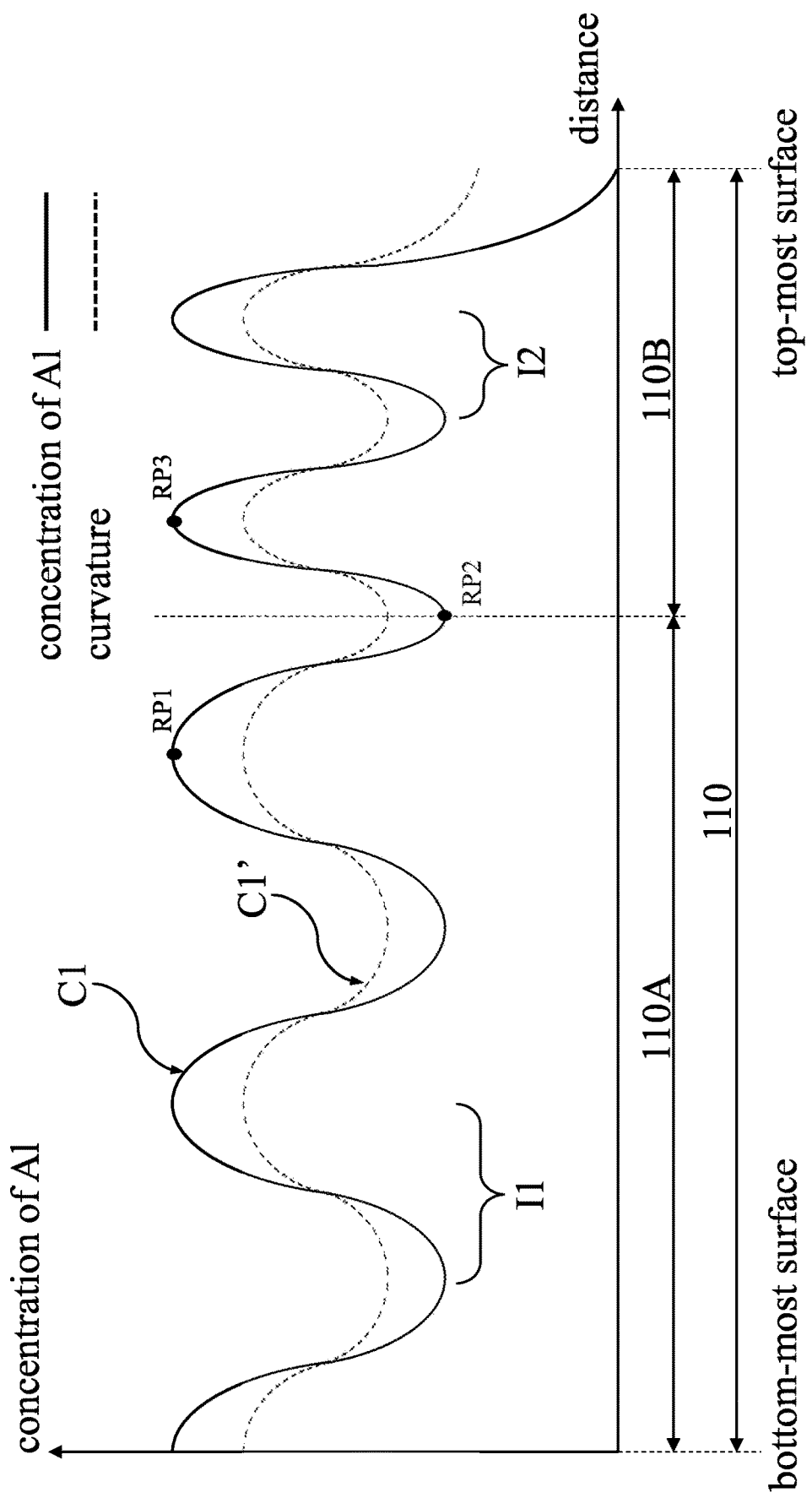
FIG. 5 is a graph showing a variable concentration of aluminum in the buffer layer versus a distance within a thickness of the same according to some embodiments of the present disclosure.

Referring to FIGS. 1 and 5, in which FIG. 5 is a graph showing a variable concentration of aluminum in the buffer layer 110 versus a distance within a thickness of the same according to some embodiments of the present disclosure, the buffer layer 110 can have two sub-layers 110A and 110B. The sub-layers 110A and 110B are stacked sequentially from the nucleation layer 104. In some embodiments, a distinguishable interface exists between adjacent two of the sub-layers 110A and 110B. The interfaces are parallel with the bottom-most surface of the buffer layer 110. In alternative embodiments, the adjacent two of the sub-layers 110A and 110B may be merged and thus there is no distinguishable interface therebetween.

As shown in FIG. 5, the buffer layer 110 has a concentration of aluminum oscillating within the buffer layer 110, such that the concentration of aluminum can vary as an oscillating function of a distance within a thickness of the buffer layer 110. The relationship curve C1 is made with labeled by reference points, RP1, RP2, and RP3 for convenient reference. As viewed in the structure of the semiconductor device 100, the reference points RP1-RP3 are respectively positioned at first, second, and third distances from a top surface of the nucleation layer 104, and the second distance is between the first and third distances (i.e., the second distance is greater than the first distance). As viewed in the oscillating function, the reference point RP1 is located at a peak of the last wave in the sub-layer 110A. The reference point RP2 is located at a trough on an interface between the sub-layers 110A and 110B. The reference point RP3 is located at a peak of the first wave in the sub-layer 110B.

Within the buffer layer 110, the concentration of aluminum can oscillate, such that the concentration of aluminum decrementally decreases and then incrementally increases (or incrementally increases and then decrementally decreases) within the buffer layer 110 with respect to the reference point RP1.

The sub-layer 110A can be formed with a low oscillation rate. The sub-layer 110B can be formed with a high oscillation rate. As such, spacings among adjacent peaks of the oscillating function change from wide to narrow with respect to the reference point RP1 within the buffer layer 110. In this regard, the change of the spacings among the adjacent peaks of the oscillating function from wide to narrow is along a direction pointing from the bottom-most surface toward the top-most surface of the buffer layer 110 (i.e., a direction pointing from the nucleation layer 104 toward the nitride-based semiconductor layer 120). In other words, spacings among adjacent troughs of the oscillating function can also change from wide to narrow with respect to the reference point RP1 within the buffer layer 110.

Explained in different way, an oscillation rate between the reference points RP1 and RP2 within the buffer layer 110 is less than an oscillation rate between the reference points RP2 and RP3 within the buffer layer 110. Therefore, the total oscillation rate in the concentration of aluminum per unit thickness of the buffer layer 110 can vary with respect to the reference point RP2 within the buffer layer 110. The oscillation rate in the concentration of aluminum per unit thickness of the buffer layer 110 can increase (i.e., from low to high) with respect to the reference point RP2 within the buffer layer 110. As viewed in the oscillating function, the oscillating function incrementally can increase from a trough to an adjacent peak within a thickness interval I1 of the sub-layer 110A; the oscillating function incrementally can increase from a trough to an adjacent peak within a thickness interval I2 of the sub-layer 110B; and the thickness interval I1 is longer than the thickness interval I2.

From a viewpoint of waveform, a graph of the variable concentration of aluminum versus the distance within the thickness of the buffer layer 110 has two different periodic curves. The variable concentration in the sub-layer 110A is one periodic curve. The variable concentration in the sub-layer 110B is another one periodic curve. In some embodiments, each of these two periodic curves change periodically. These two periodic curves oscillate with different frequencies, in which the frequency in the sub-layer 110A is lower than the frequency in the sub-layer 110B, which results from that the spacings among the adjacent peaks of change from wide to narrow. Moreover, the frequencies of the incremental increases and decremental decreases of the oscillating function can get raised as well. In other words, the oscillating function can be regarded as a wave function having a plurality of waves, and wavelengths of the waves become gradually smaller as the concentration of aluminum oscillates within the buffer layer 110.

The graph of FIG. 5 further reflects a relationship curve C1' for the curvature of the buffer layer 110. Since the concentration of aluminum of the buffer layer 110 oscillates with different oscillation rates, low to high, the change of the curvature of the buffer layer 110 will be low to high as well. The curvature does not become very positive or negative in this manner.

The reason for such formation of the buffer layer 110 is to maintain the desired thickness of the buffer layer 110. For example, during the formation of the buffer layer 110 which is set to have more than four periodic waves, when the stage of the formation of the sub-layer 110A goes at reference point RP2 and it is found the rest of the buffer layer 110 does not have the enough thickness to contain two periodic waves with the low oscillation rate, the oscillation rate can be increased at the reference point RP2 such that the rest of the buffer layer 110 is capable of containing two periodic waves. As a result, the buffer layer 110 can be formed with matching the desired thickness and the periodic waves of the concentration of aluminum can avoid accumulation of stress during the formation.

Furthermore, in the sub-layer 110A or 110B, all of the peaks of the oscillating function can correspond to the same value of the concentration of aluminum. In the sub-layer 110A 110B, all of the troughs of the oscillating function can correspond to the same value of the concentration of aluminum. Such configuration is made to simplify the formation of the buffer layer 110.

In the buffer layer 110, at the end of the oscillating function of the concentration of aluminum, the value of the concentration of aluminum decrease to zero or approach to zero. This interval can be formed by different approaches, such that the variation of aluminum concentration of this interval may be different than the exemplary illustration, such as different gradient or sustained thickness. For example, in some embodiments, the aluminum concentration in this interval may linearly and decrementally decrease. Therefore, the concentration of aluminum at a beginning point of the oscillating function is greater than the concentration of aluminum at an end point of the oscillating function.

When a measurement to an aluminum concentration is performed on the buffer layer 110, in addition to "decremental decrease and then incremental increase" or "incremental increase and then decrementally decrease", the result will also show different spacings among the adjacent peaks/troughs.

In some embodiments, the buffer layer 110 has a thickness over about 1 μm. The thickness of the buffer layer 110 may be varied of interest or can be changed based on the design requirements. For example, the semiconductor device 100 can be configured to work in a relatively low voltage condition (e.g., about 100V or less) in some embodiments, and the buffer layer 110 can have a thickness in a range from about 1 μm to about 2 μm. For example, the semiconductor device 100 can be configured to work in a relatively high voltage condition (e.g., over about 100V), and the buffer layer 110 can have a thickness over about 2 μm in some other embodiments. The buffer layer 110 which has relatively greater thickness can endure or withstand relatively greater breakdown voltage. The buffer layer 110 which has relatively greater thickness can endure or withstand relatively greater vertical breakdown voltage. The operating voltage or work voltage of the semiconductor device 100 can be positively correlated to the breakdown voltage of the buffer layer 110. The operating voltage or work voltage of the semiconductor device 100 can be positively correlated to the vertical breakdown voltage of the buffer layer 110. For example, the buffer layer 110 can have a thickness in a range from about 1 μm to about 2 μm to endure or withstand a breakdown voltage ranging from about 200V to about 500V in some other embodiments. For example, the buffer layer 110 can have a thickness in a range from about 1 μm to about 2 μm to endure or withstand a vertical breakdown voltage ranging from about 200V to about 500V in some other embodiments. For example, the buffer layer 110 can have a thickness in a range from about 4 μm to about 10 μm to endure or withstand a breakdown voltage up to about 400V to about 2500V in some other embodiments. For example, the buffer layer 110 can have a thickness in a range from about 4 μm to about 10 μm to endure or withstand a vertical breakdown voltage up to about 400V to about 2500V in some other embodiments. For example, the buffer layer 110 can have a thickness in a range from about 1 μm to about 50 μm to endure or withstand a breakdown voltage ranging from about 200V to about 12,500V in some other embodiments. For example, the buffer layer 110 can have a thickness in a range from about 1 μm to about 50 μm to endure or withstand a vertical breakdown voltage ranging from about 200V to about 12,500V in some other embodiments. For example, the buffer layer 110 can have a relatively great thickness as the voltage applied to the semiconductor device 100 goes up. In some other embodiments, the buffer layer 110 can have a thickness over about 50 μm to endure or withstand a breakdown voltage over about 12,500V.

For a HEMT device, it is an important factor that if a buffer layer is thick enough. If a buffer layer has a thickness which is not as thick as enough, there would be a leakage current flowing to a bottom substrate. If a buffer layer has a thickness which is as thick as enough but does not have a variable concentration of aluminum as above, there would be a warpage issue occurring across the buffer layer or a layer to be formed on the buffer layer. In this regard, since the buffer layer 110 is formed to have the variable concentration of aluminum as above, the warpage issue is avoided and the buffer layer 110 has the thickness which can avoid occurrence of a leakage current. Moreover, the varied oscillation rate can make the buffer layer 110 have the enough number of the cycles in the oscillation function, so as to fit the layer design.

Referring to FIG. 1 again, the gate structure 124 is disposed on the nitride-based semiconductor layer 122. The gate structure 124 may include a p-type doped III-V compound semiconductor layer 126 and a conductive gate 128. The conductive gate 128 can serve as a metal gate. The p-type doped III-V compound semiconductor layer 126 and the conductive gate 128 are stacked on the nitride-based semiconductor layer 122. The p-type doped III-V compound semiconductor layer 126 is between the nitride-based semiconductor layer 122 and the conductive gate 128. In some embodiments, the gate structure 124 may further include a dielectric layer (not illustrated) between the p-type doped III-V compound layer 126 and the conductive gate 128.

The semiconductor device 100 can be designed as being an enhancement mode device, which is in a normally-off state when the conductive gate 128 is at approximately zero bias. Specifically, the p-type doped III-V compound layer 126 creates a p-n junction with the nitride-based semiconductor layer 112 to deplete the 2DEG region, such that a zone of the 2DEG region corresponding to a position below the gate structure 124 has different characteristics (e.g. different electron concentrations) than the rest of the 2DEG region and thus is blocked. Due to such mechanism, the semiconductor device 100 has a normally-off characteristic. In other words, when no voltage is applied to the conductive gate 128 or a voltage applied to the conductive gate 128 is less than a threshold voltage (i.e. a minimum voltage required to form an inversion layer below the gate structure 124), the zone of the 2DEG region below the gate structure 124 is kept blocked, and thus no current flows therethrough. Moreover, by providing the p-type doped III-V compound semiconductor layer 126, gate leakage current is reduced and an increase in the threshold voltage during the off-state is achieved.

In some embodiments, the p-type doped III-V compound layer 122 can be omitted, such that the semiconductor device 100 is a depletion-mode device, which means the semiconductor device 100 in a normally-on state at zero gate-source voltage.

The exemplary materials of the p-type doped III-V compound layer 126 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In some embodiments, the nitride-based semiconductor layer 120 includes undoped GaN and the nitride-based semiconductor layer 122 includes AlGaN, and the p-type doped III-V compound layer 126 is a p-type GaN layer which can bend the underlying band structure upwards and to deplete the corresponding zone of the 2DEG region, so as to place the semiconductor device 100 into an off-state condition.

In some embodiments, the conductive gate 128 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In some embodiments, the exemplary materials of the conductive gate 128 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc.), or combinations thereof.

The passivation layer 130 is disposed over the nitride-based semiconductor layer 122. The passivation layer 130 covers the gate structure 124 for a protection purpose. The passivation layer 130 is conformal with the gate structure 124 and thus has a projection profile over the gate structure 124. The exemplary materials of the passivation layer 130 can include, for example but are not limited to, $SiN_x$, $SiO_x$, SiON, SiC, SiBN, SiCBN, oxides, nitrides, or combinations thereof. In some embodiments, the passivation layer 130 is a multi-layered structure, such as a composite dielectric layer of $Al_2O_3$/SiN, $Al_2O_3$/$SiO_2$, AlN/SiN, AlN/$SiO_2$, or combinations thereof.

The S/D electrodes 132 and 134 are disposed on the nitride-based semiconductor layer 122. The S/D electrodes 132 and 134 can serve a combination of a source and a drain. The S/D electrodes 122 and 124 are located at two opposite sides of the gate structure 124 (i.e., the gate structure 124 is located between the S/D electrodes 132 and 134). The gate structure 124 and the S/D electrodes 132 and 134 can collectively act as a GaN-based HEMT with the 2DEG region.

The S/D electrodes 132 and 134 have bottom portions penetrating the passivation layer 130 to form interfaces with the nitride-based semiconductor layer 122. The S/D electrodes 132 and 134 have top portions wider than the bottom portions thereof. The top portions of the S/D electrodes 132 and 134 extend over portions of the passivation layer 130.

In the exemplary illustration of FIG. 1, the left and right S/D electrodes 132 and 134 serve as source and drain electrodes, respectively. Although it is not shown in FIG. 1, the S/D electrodes 132 and 134 may be optionally asymmetrical about the gate structure 124. In some embodiments, the left S/D electrode 132 is closer to the gate structure 124 than the right S/D electrode 134. The present disclosure is not limited thereto, and the configuration of the S/D electrodes 132 and 134 is adjustable.

In some embodiments, each of the S/D electrodes 132 and 134 includes one or more conformal conductive layers. In some embodiments, the S/D electrodes 132 and 134 can include, for example but are not limited to, metals, alloys, doped semiconductor materials (such as doped crystalline silicon), other conductor materials, or combinations thereof. The exemplary materials of the S/D electrodes 132 and 134 can include, for example but are not limited to, Ti, AlSi, TiN, or combinations thereof. In some embodiments, each of the S/D electrodes 132 and 134 forms ohmic contact with the nitride-based semiconductor layer 122. The ohmic contact can be achieved by applying Ti, Al, or other suitable materials for the S/D electrodes 132 and 134. In some embodiments, a dielectric layer (not illustrated), such as SiN, can be disposed between the nitride-based semiconductor layer 122 and the S/D electrodes 132 and 134. In some embodiments, the number of the S/D electrodes can be increased, and the number of the gate electrodes is corresponding increased as well. For example, the semiconductor device 100 can have three S/D electrodes and two gate electrodes located among the S/D electrodes.

The passivation layer 136 is disposed above the passivation layer 130 and the S/D electrodes 132 and 134. The passivation layer 136 covers the GaN-based HEMT. The passivation layer 136 covers the S/D electrodes 122 and 124. The passivation layer 128 forms interfaces with sidewalls and top surfaces of the S/D electrodes 122 and 124. The passivation layer 136 may have a flat topmost surface, which is able to act as a flat base for carrying layers formed in a step subsequent to the formation thereof. The exemplary materials of the passivation layer 136 can include, for example but are not limited to, $SiN_x$, $SiO_x$, SiON, SiC, SiBN, SiCBN, oxides, nitrides, or combinations thereof. In some embodiments, the passivation layer 136 is a multi-layered structure, such as a composite dielectric layer of $Al_2O_3$/SiN, $Al_2O_3$/$SiO_2$, AlN/SiN, AlN/$SiO_2$, or combinations thereof.

The vias 138 penetrate the passivation layer 136 to connect to the gate structure 124 and the S/D electrodes 132 and 134. The vias 138 form interfaces with the gate structure 124 and the S/D electrodes 132 and 134. The exemplary materials of the vias 138 can include, for example but are not limited to, Cu, Al, or combinations thereof.

The patterned conductive layer 140 is disposed on the passivation layer 136. The patterned conductive layer 140 has a plurality of metal lines over the gate structure 124 and the S/D electrodes 132 and 134 for the purpose of implementing interconnects between circuits. The metal lines are in contact with the vias 138, respectively, such that the gate structure 124 and the S/D electrodes 132 and 134 can be arranged into a circuit. For example, the GaN-based HEMT can be electrically connected to other component(s) via the metal lines of the patterned conductive layer 140. In other embodiments, the patterned conductive layer 140 may include pads or traces for the same purpose.

In addition to changing the aluminum concentration as being variable, a concentration for other elements in the buffer layer may be variable as well. In this regard, since aluminum is a group III element, other group III concentration may be correspondingly fluctuated once the aluminum concentration increases or decreases. For example, due to the buffer layer including AlGaN, once the aluminum concentration increases or decreases, the concentration of gallium would increase or decrease.

Figure 6:
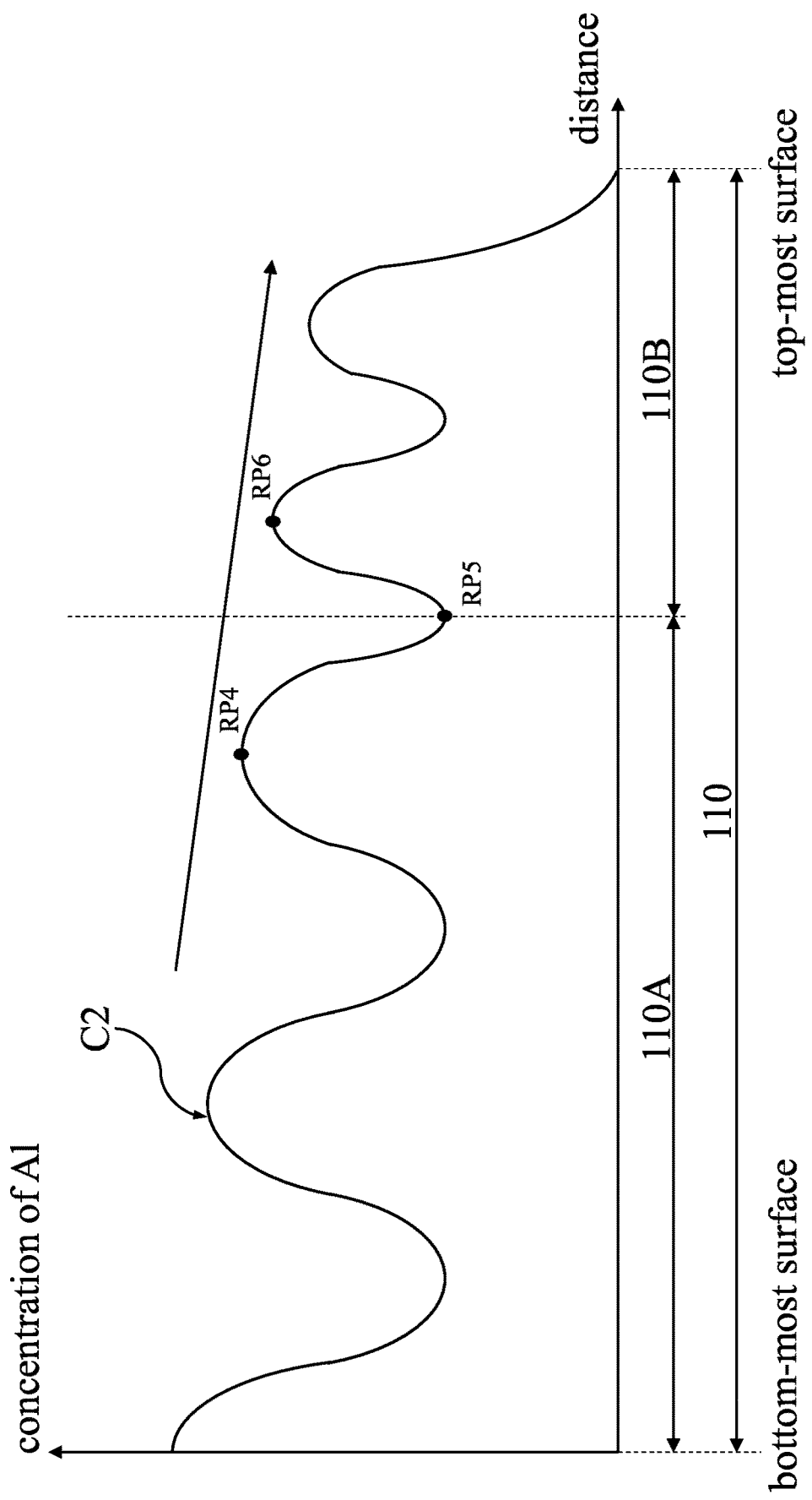
FIG. 6 is a graph showing a variable concentration of aluminum in a buffer layer versus a distance within a thickness of the same according to some embodiments of the present disclosure.

FIG. 6 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 6, the buffer layer 110 has a concentration of aluminum oscillating within the buffer layer 110, such that the concentration of aluminum can vary as an oscillating function of a distance within a thickness of the buffer layer 110. The relationship curve C2 is made with labeled by reference points RP4, RP5, and RP6 for convenient reference. As viewed in the oscillating function, the reference point RP4 is located at a peak of the last wave in the sub-layer 110A. The reference point RP5 is located at a trough on an interface between the sub-layers 110A and 110B. The reference point RP6 is located at a peak of the first wave in the sub-layer 110B.

In the present embodiment, the peaks of the oscillating function correspond to values of the concentration of aluminum which decrease as the spacings become narrower. For example, the reference point RP4 corresponds to a value of the concentration of aluminum greater than a value of the concentration of aluminum that the reference point RP6 correspond to. Furthermore, all of the troughs of the oscillating function correspond to the same value of the concentration of aluminum. For example, the reference point RP5 corresponds to a value of the concentration of aluminum substantially equal to a value of the concentration of aluminum that the adjacent trough corresponds to.

Figure 7:
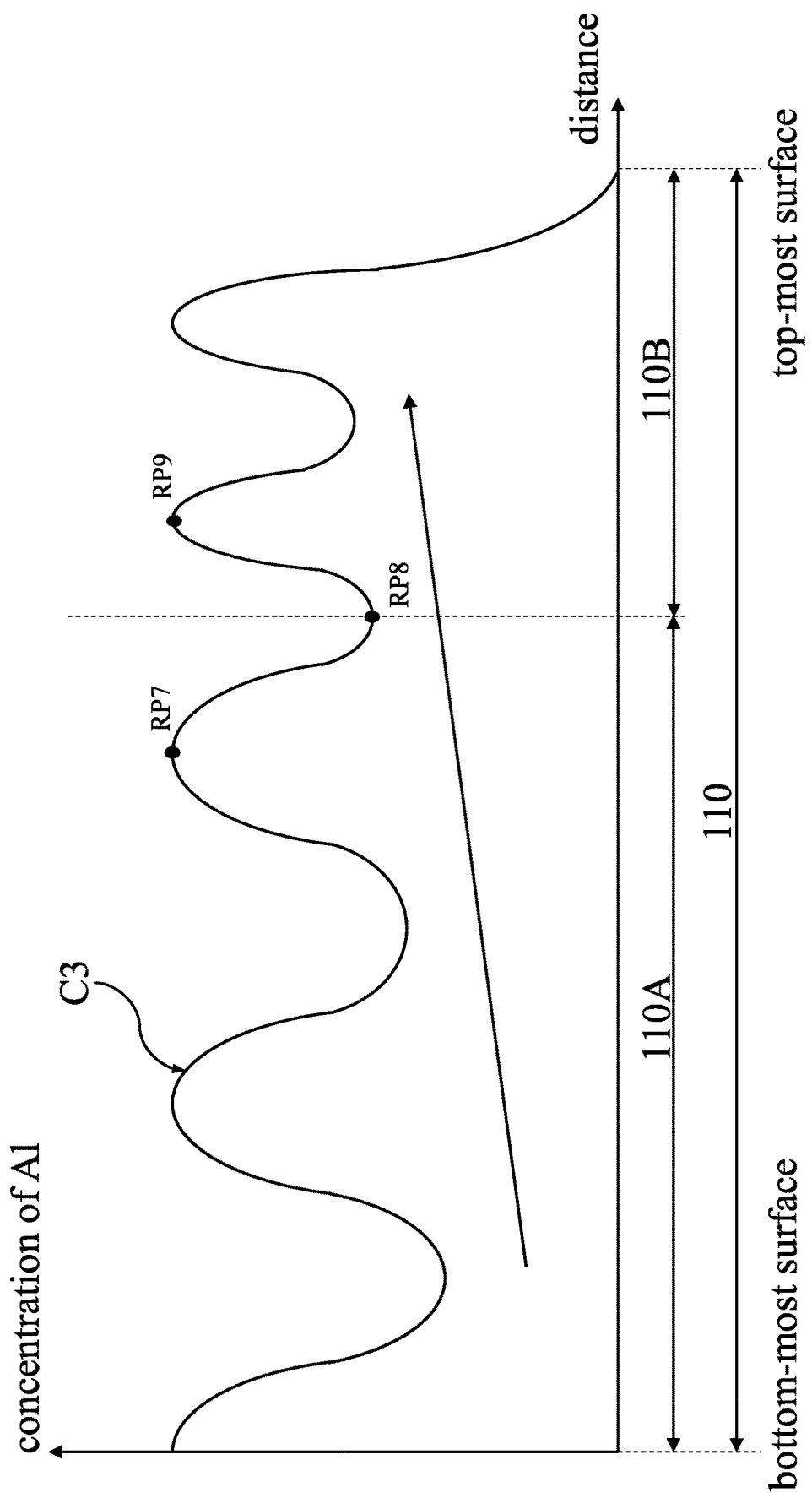
FIG. 7 is a graph showing a variable concentration of aluminum in a buffer layer versus a distance within a thickness of the same according to some embodiments of the present disclosure.

FIG. 7 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 7, the buffer layer 110 has a concentration of aluminum oscillating within the buffer layer 110, such that the concentration of aluminum can vary as an oscillating function of a distance within a thickness of the buffer layer 110. The relationship curve C3 is made with labeled by reference points RP7, RP8, and RP9 for convenient reference. As viewed in the oscillating function, the reference point RP7 is located at a peak of the last wave in the sub-layer 110A. The reference point RP8 is located at a trough on an interface between the sub-layers 110A and 110B. The reference point RP9 is located at a peak of the first wave in the sub-layer 110B.

In the present embodiment, the troughs of the oscillating function correspond to values of the concentration of aluminum which increase as the spacings become narrower. For example, the reference point RP8 corresponds to a value of the concentration of aluminum greater than a value of the concentration of aluminum that the left trough corresponds to. The reference point RP8 corresponds to a value of the concentration of aluminum less than a value of the concentration of aluminum that the right trough corresponds to. Furthermore, all of the peaks of the oscillating function correspond to the same value of the concentration of the aluminum. For example, the reference points RP7 and RP9 corresponds to the same value of the concentration of aluminum.

Figure 8:
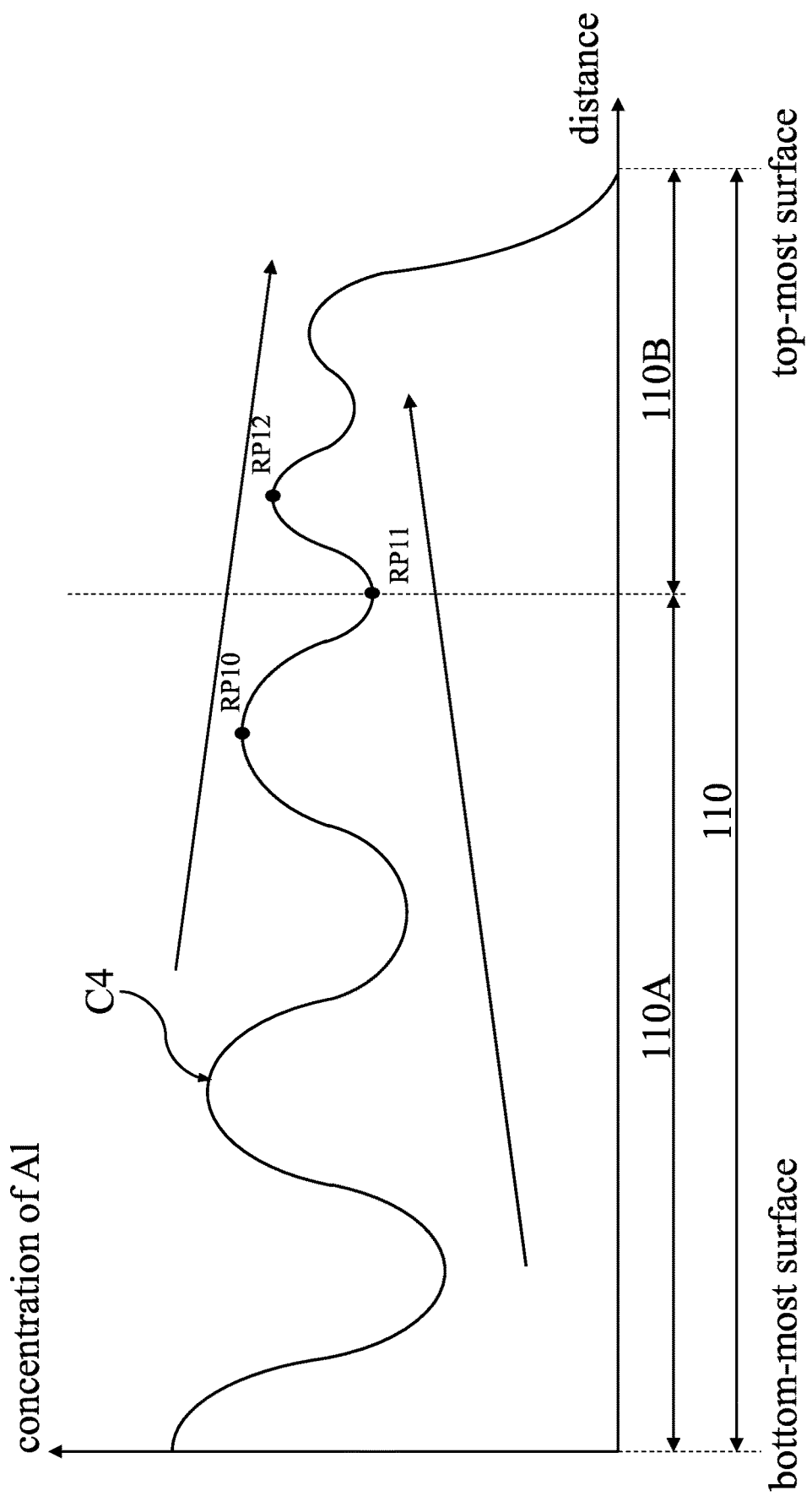
FIG. 8 is a graph showing a variable concentration of aluminum in a buffer layer versus a distance within a thickness of the same according to some embodiments of the present disclosure.

FIG. 8 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 8, the buffer layer 110 has a concentration of aluminum oscillating within the buffer layer 110, such that the concentration of aluminum can vary as an oscillating function of a distance within a thickness of the buffer layer 110. The relationship curve C4 is made with labeled by reference points RP10, RP11, and RP12 for convenient reference. As viewed in the oscillating function, the reference point RP10 is located at a peak of the last wave in the sub-layer 110A. The reference point RP11 is located at a trough on an interface between the sub-layers 110A and 110B. The reference point RP12 is located at a peak of the first wave in the sub-layer 110B.

In the present embodiment, the peaks of the oscillating function correspond to values of the concentration of aluminum which decrease as the spacings become narrower, and the troughs of the oscillating function correspond to values of the concentration of aluminum which increase as the spacings become narrower. For example, the reference point RP10 corresponds to a value of the concentration of aluminum greater than a value of the concentration of aluminum that the reference point RP12 correspond to. The reference point RP11 corresponds to a value of the concentration of aluminum greater than a value of the concentration of aluminum that the left trough corresponds to. The reference point RP11 corresponds to a value of the concentration of aluminum less than a value of the concentration of aluminum that the right trough corresponds to. Therefore, in the oscillating function, the concentration of aluminum can oscillate to converge toward a steady value. Each of the decreases can make the concentration of aluminum approaches to the steady value.

Figure 9:
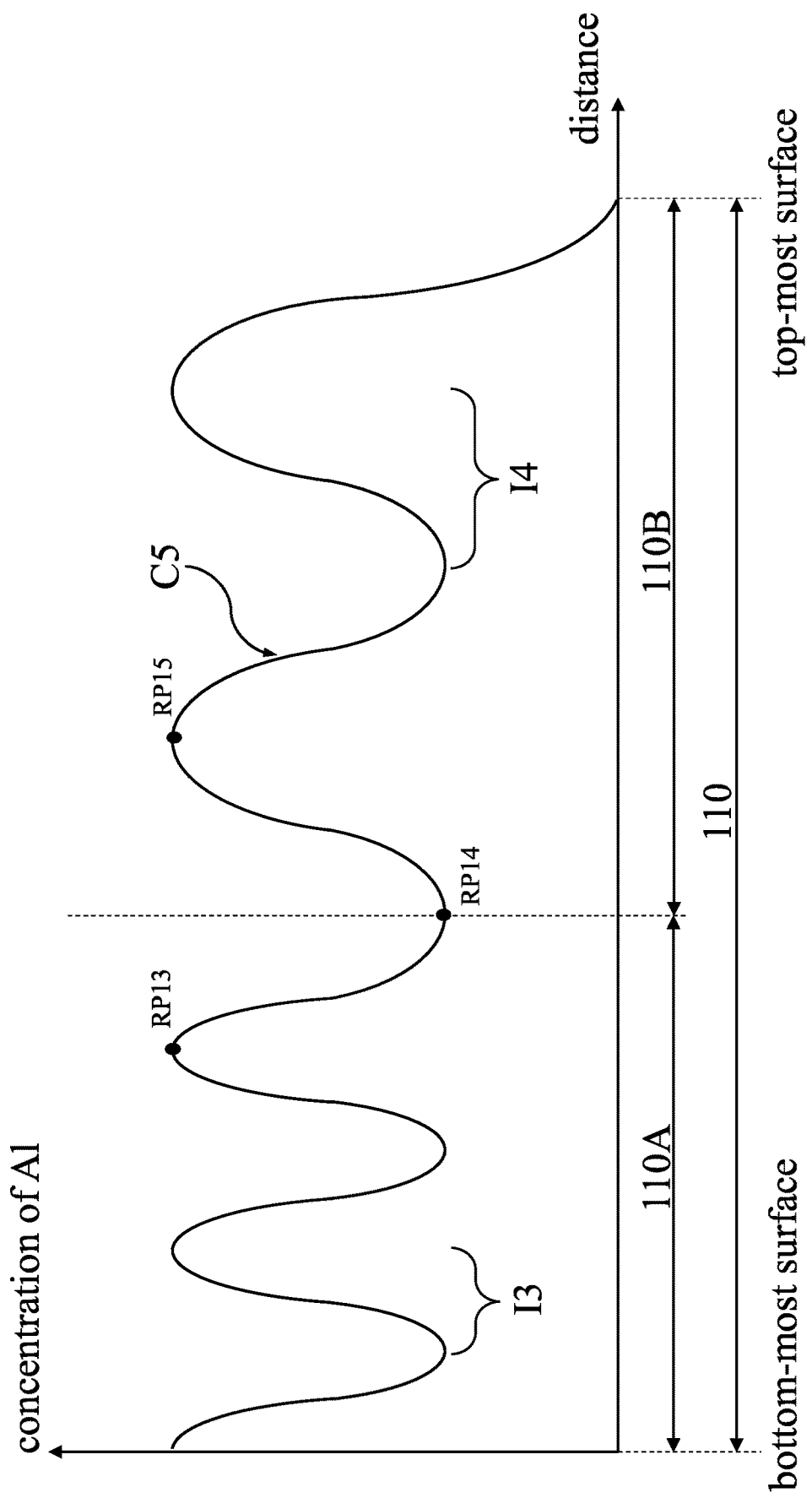
FIG. 9 is a graph showing a variable concentration of aluminum in a buffer layer versus a distance within a thickness of the same according to some embodiments of the present disclosure.

FIG. 9 is a graph showing a variable concentration of aluminum in a buffer layer 110 versus a distance within a thickness of the same according to some embodiments of the present disclosure. The buffer layer 110 can have two sub-layers 110A and 110B. The sub-layers 110A and 110B are stacked sequentially.

As shown in FIG. 9, the buffer layer 110 has a concentration of aluminum oscillating within the buffer layer 110, such that the concentration of aluminum can vary as an oscillating function of a distance within a thickness of the buffer layer 110. The relationship curve C5 is made with labeled by reference points, RP13, RP14, and RP15 for convenient reference. As viewed in the oscillating function, the reference point RP13 is located at a peak of the last wave in the sub-layer 110A. The reference point RP14 is located at a trough on an interface between the sub-layers 110A and 110B. The reference point RP15 is located at a peak of the first wave in the sub-layer 110B.

In the present embodiment, the sub-layer 110A can be formed with a high oscillation rate. The sub-layer 110B can be formed with a low oscillation rate. As such, spacings among adjacent peaks of the oscillating function change from narrow to wide with respect to the reference point RP13 within the buffer layer 110. In this regard, the change of the spacings among the adjacent peaks of the oscillating function from narrow to wide is along a direction pointing from the bottom-most surface toward the top-most surface of the buffer layer 110 (i.e., a direction pointing from a nucleation layer toward a nitride-based semiconductor layer). In other words, spacings among adjacent troughs of the oscillating function can also change from narrow to wide with respect to the reference point RP13 within the buffer layer 110.

Explained in different way, an oscillation rate between the reference points RP13 and RP14 within the buffer layer 110 is greater than an oscillation rate between the reference points RP14 and RP15 within the buffer layer 110. Therefore, the total oscillation rate in the concentration of aluminum per unit thickness of the buffer layer 110 can vary with respect to the reference point RP14 within the buffer layer 110. The oscillation rate in the concentration of aluminum per unit thickness of the buffer layer 110 can decrease (i.e., from high to low) with respect to the reference point RP14 within the buffer layer 110. As viewed in the oscillating function, the oscillating function incrementally can increase from a trough to an adjacent peak within a thickness interval I3 of the sub-layer 110A; the oscillating function incrementally can increase from a trough to an adjacent peak within a thickness interval I4 of the sub-layer 110B; and the thickness interval I3 is shorter than the thickness interval I4.

From a viewpoint of waveform, a graph of the variable concentration of aluminum versus the distance within the thickness of the buffer layer 110 has two different periodic curves. The variable concentration in the sub-layer 110A is one periodic curve. The variable concentration in the sub-layer 110B is another one periodic curve. In some embodiments, each of these two periodic curves change periodically. These two periodic curves oscillate with different frequencies, in which the frequency in the sub-layer 110A is higher than the frequency in the sub-layer 110B, which results from that the spacings among the adjacent peaks of change from narrow to wide. Moreover, the frequencies of the incremental increases and decremental decreases of the oscillating function can get lowered as well. In other words, the oscillating function can be regarded as a wave function having a plurality of waves, and wavelengths of the waves become gradually greater as the concentration of aluminum oscillates within the buffer layer 110.

The reason for such formation of the buffer layer 110 is to maintain the desired thickness of the buffer layer 110. For example, during the formation of the buffer layer 110 which is set to have more than five periodic waves, when the stage of the formation of the sub-layer 110A goes at reference point RP14 and it is found the rest of the buffer layer 110 does have the enough thickness to contain two periodic waves with the low oscillation rate, the oscillation rate can be decreased at the reference point RP14 such that the rest of the buffer layer 110 can be formed with the low oscillation rate, which will make the growth quality of the buffer layer 110 improved. As a result, the buffer layer 110 can be formed with matching the desired thickness and the periodic waves of the concentration of aluminum can avoid accumulation of stress during the formation. Moreover, the growth quality of the buffer layer 110 can get improved.

Furthermore, in the sub-layer 110A or 110B, all of the peaks of the oscillating function can correspond to the same value of the concentration of aluminum. In the sub-layer 110A 110B, all of the troughs of the oscillating function can correspond to the same value of the concentration of aluminum. Such configuration is made to simplify the formation of the buffer layer 110.

Figure 10:
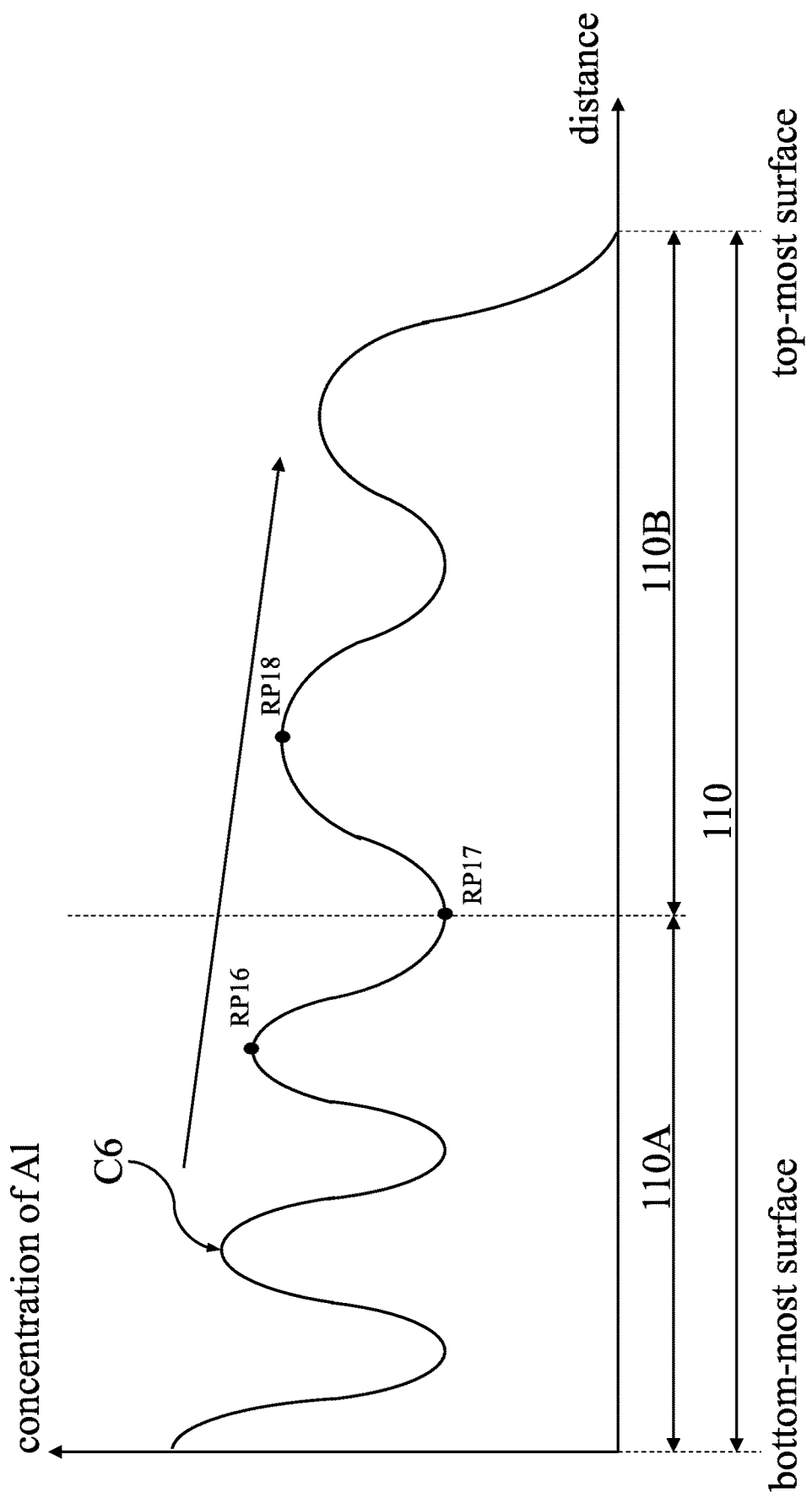
FIG. 10 is a graph showing a variable concentration of aluminum in a buffer layer versus a distance within a thickness of the same according to some embodiments of the present disclosure.

FIG. 10 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 10, the buffer layer 110 has a concentration of aluminum oscillating within the buffer layer 110, such that the concentration of aluminum can vary as an oscillating function of a distance within a thickness of the buffer layer 110. The relationship curve C6 is made with labeled by reference points RP16, RP17, and RP18 for convenient reference. As viewed in the oscillating function, the reference point RP16 is located at a peak of the last wave in the sub-layer 110A. The reference point RP17 is located at a trough on an interface between the sub-layers 110A and 110B. The reference point RP18 is located at a peak of the first wave in the sub-layer 110B.

In the present embodiment, the peaks of the oscillating function correspond to values of the concentration of aluminum which decrease as the spacings become wider. For example, the reference point RP16 corresponds to a value of the concentration of aluminum greater than a value of the concentration of aluminum that the reference point RP18 correspond to. Furthermore, all of the troughs of the oscillating function correspond to the same value of the concentration of aluminum. For example, the reference point RP17 corresponds to a value of the concentration of aluminum substantially equal to a value of the concentration of aluminum that the adjacent trough corresponds to.

Figure 11:
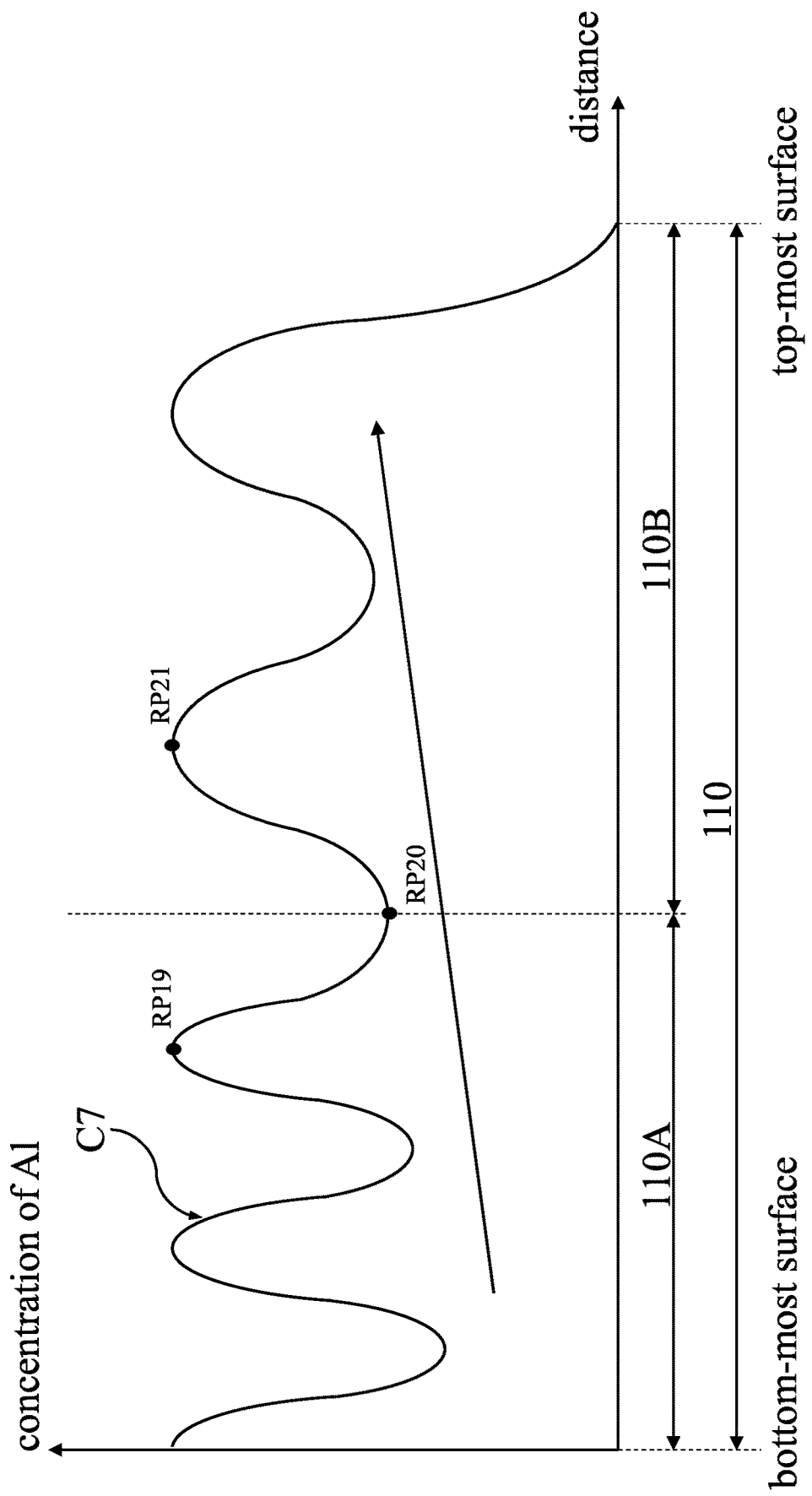
FIG. 11 is a graph showing a variable concentration of aluminum in a buffer layer versus a distance within a thickness of the same according to some embodiments of the present disclosure.

FIG. 11 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 11, the buffer layer 110 has a concentration of aluminum oscillating within the buffer layer 110, such that the concentration of aluminum can vary as an oscillating function of a distance within a thickness of the buffer layer 110. The relationship curve C7 is made with labeled by reference points RP19, RP20, and RP21 for convenient reference. As viewed in the oscillating function, the reference point RP19 is located at a peak of the last wave in the sub-layer 110A. The reference point RP20 is located at a trough on an interface between the sub-layers 110A and 110B. The reference point RP21 is located at a peak of the first wave in the sub-layer 110B.

In the present embodiment, the troughs of the oscillating function correspond to values of the concentration of aluminum which increase as the spacings become wider. For example, the reference point RP20 corresponds to a value of the concentration of aluminum greater than a value of the concentration of aluminum that the left trough corresponds to. The reference point RP20 corresponds to a value of the concentration of aluminum less than a value of the concentration of aluminum that the right trough corresponds to. Furthermore, all of the peaks of the oscillating function correspond to the same value of the concentration of the aluminum. For example, the reference points RP19 and RP21 corresponds to the same value of the concentration of aluminum.

Figure 12:
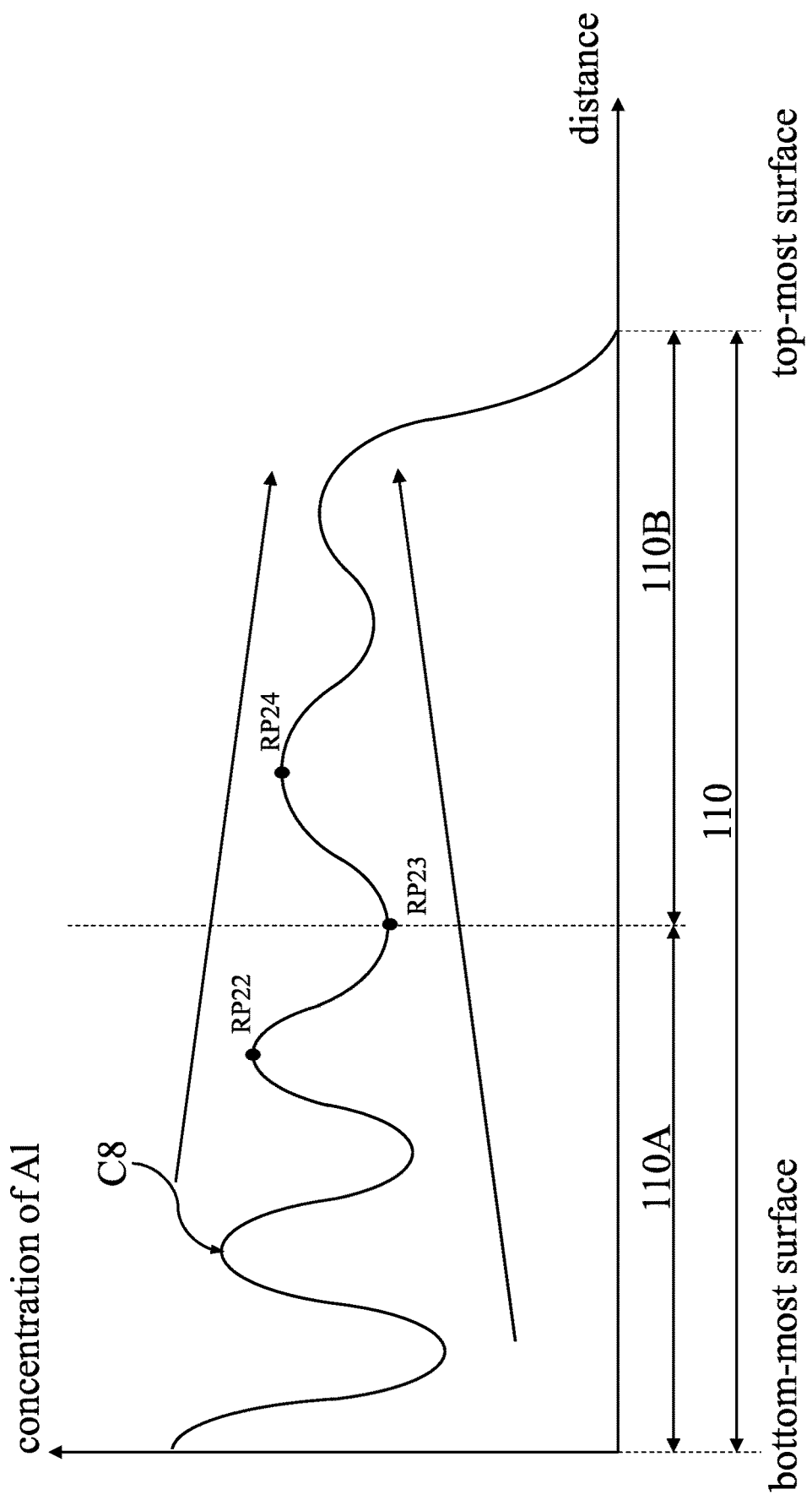
FIG. 12 is a graph showing a variable concentration of aluminum in a buffer layer versus a distance within a thickness of the same according to some embodiments of the present disclosure.

FIG. 12 is a graph showing a variable concentration of aluminum in a buffer layer 110 versus a distance within a thickness of the same according to some embodiments of the present disclosure, the buffer layer 110 can have two sub-layers 110A and 110B. The sub-layers 110A and 110B are stacked sequentially. As shown in FIG. 12, the buffer layer 110 has a concentration of aluminum oscillating within the buffer layer 110, such that the concentration of aluminum can vary as an oscillating function of a distance within a thickness of the buffer layer 110. The relationship curve C8 is made with labeled by reference points RP22, RP23, and RP24 for convenient reference. As viewed in the oscillating function, the reference point RP22 is located at a peak of the last wave in the sub-layer 110A. The reference point RP23 is located at a trough on an interface between the sub-layers 110A and 110B. The reference point RP24 is located at a peak of the first wave in the sub-layer 110B.

In the present embodiment, the peaks of the oscillating function correspond to values of the concentration of aluminum which decrease as the spacings become wider, and the troughs of the oscillating function correspond to values of the concentration of aluminum which increase as the spacings become narrower. For example, the reference point RP22 corresponds to a value of the concentration of aluminum greater than a value of the concentration of aluminum that the reference point RP24 correspond to. The reference point RP23 corresponds to a value of the concentration of aluminum greater than a value of the concentration of aluminum that the left trough corresponds to. The reference point RP23 corresponds to a value of the concentration of aluminum less than a value of the concentration of aluminum that the right trough corresponds to. Therefore, in the oscillating function, the concentration of aluminum can oscillate to converge toward a steady value. Each of the decreases can make the concentration of aluminum approaches to the steady value.

Figure 13:
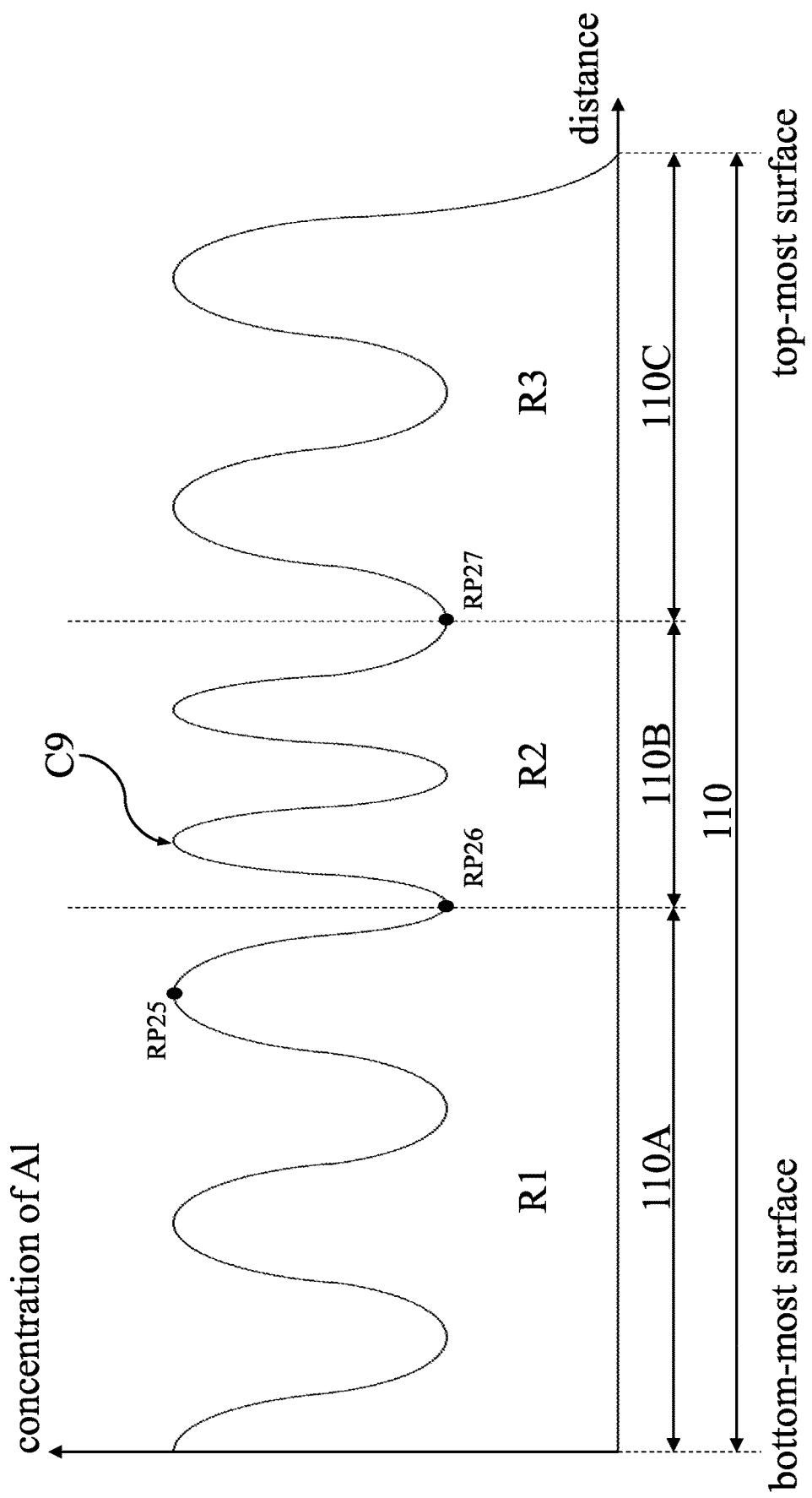
FIG. 13 is a graph showing a variable concentration of aluminum in a buffer layer versus a distance within a thickness of the same according to some embodiments of the present disclosure.

FIG. 13 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 13, the buffer layer 110 has a concentration of aluminum oscillating within the buffer layer 110, such that the concentration of aluminum can vary as an oscillating function of a distance within a thickness of the buffer layer 110. The relationship curve C9 is made with labeled by reference points RP25, RP26, and RP27 for convenient reference. As viewed in the oscillating function, the reference point RP25 is located at a peak on the last wave of the sub-layer 110A. The reference point RP26 is located at a trough on an interface between the sub-layers 110A and 110B, and the reference point RP27 is located at a trough on an interface between the sub-layers 110B and 110C.

In the present embodiment, the spacings among the adjacent peaks of the oscillating function change from wide to narrow and then change from narrow to wide with respect to the reference point RP25 within the buffer layer 110. More specifically, an oscillation rate between reference points RP26 and RP27 within the buffer layer 110 is greater than that within the rest of within the buffer layer 110 (i.e., the interval in front of the reference point RP26 and the interval behind the reference point RP27).

Accordingly, with respect to the reference point RP25, the oscillation rate in the concentration of the aluminum per unit thickness of the buffer layer 110 increases from the reference point RP26, and then decreases from the reference point RP27. For example, the oscillation rate in the concentration of the aluminum per unit thickness of the buffer layer 110 can include sub-oscillation rates R1, R2, and R3 in sequence with respect to the reference point RP25 within the buffer layer 110, and R2>R1=R3.

The reason for such formation of the buffer layer 110 is to maintain the desired thickness of the buffer layer 110. For example, during the formation of the buffer layer 110 which is set to have more than six periodic waves, when the stage of the formation of the sub-layer 110A goes at reference point RP26 and it is found the rest of the buffer layer 110 may not have the enough thickness to contain the follow-up periodic waves with the low oscillation rate, the oscillation rate can be increased at the reference point RP26 such that the growth of the buffer layer 110 can be continued with the high oscillation rate. Then, when the stage of the formation of the sub-layer 110A goes at reference point RP27 and it is found the rest of the buffer layer 110 does have the enough thickness to contain two periodic waves with the low oscillation rate, the oscillation rate can be decreased at the reference point RP27 such that the growth of the buffer layer 110 can be continued with the low oscillation rate, which will make the growth quality of the buffer layer 110 improved. As a result, the buffer layer 110 can be formed with matching the desired thickness, and the periodic waves of the concentration of aluminum can avoid accumulation of stress during the formation. Moreover, the growth quality of the buffer layer 110 can get improved.

Furthermore, in the sub-layer 110A, 110B, or 110C, all of the peaks of the oscillating function can correspond to the same value of the concentration of aluminum. In the sub-layer 110A, 110B, or 110C, all of the troughs of the oscillating function can correspond to the same value of the concentration of aluminum. Such configuration is made to simplify the formation of the buffer layer 110.

Figure 14:
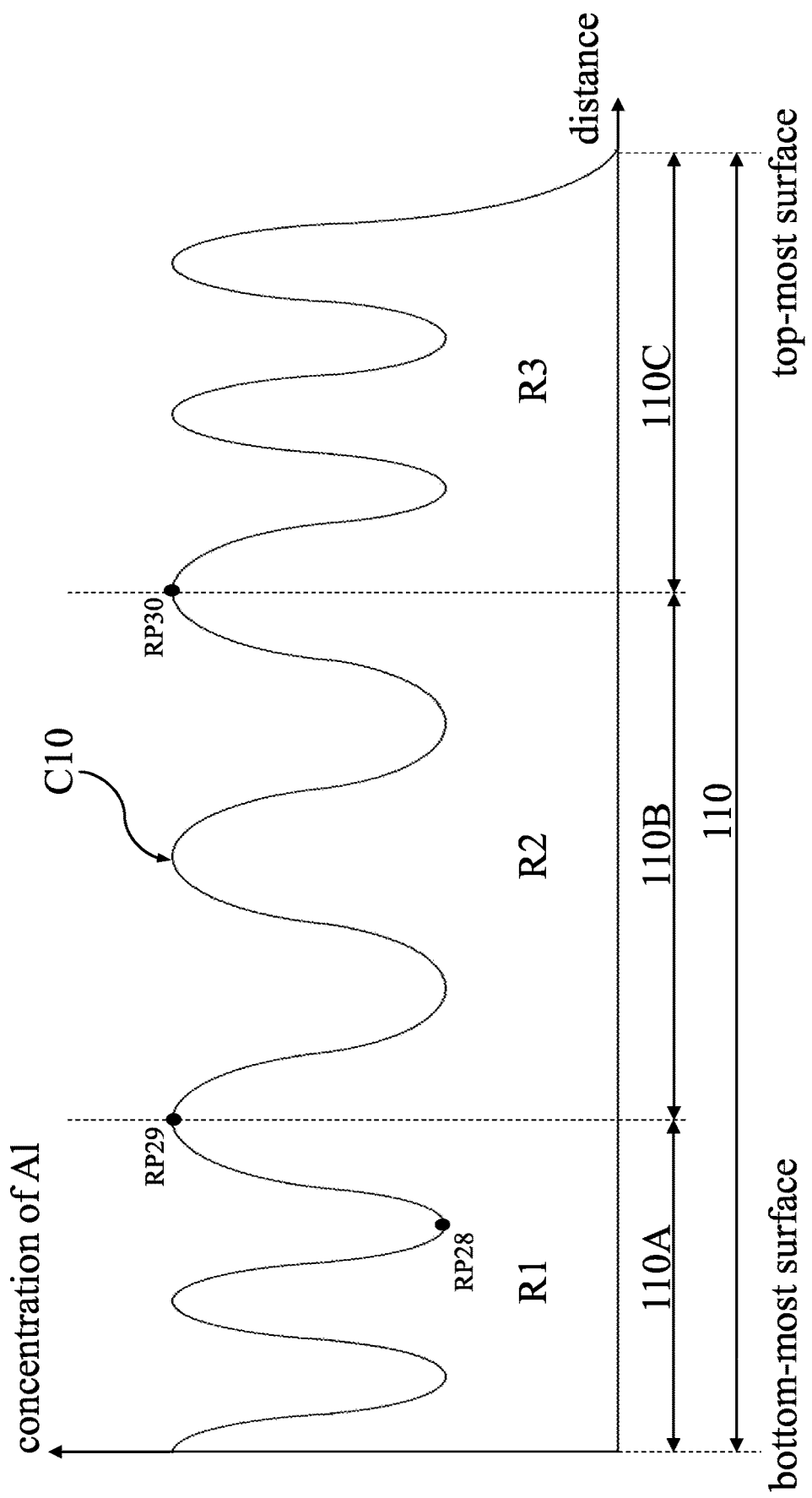
FIG. 14 is a graph showing a variable concentration of aluminum in a buffer layer versus a distance within a thickness of the same according to some embodiments of the present disclosure.

FIG. 14 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 14, the buffer layer 110 has a concentration of aluminum oscillating within the buffer layer 110, such that the concentration of aluminum can vary as an oscillating function of a distance within a thickness of the buffer layer 110. The relationship curve C10 is made with labeled by reference points RP28, RP29, and RP30 for convenient reference. As viewed in the oscillating function, the reference point RP28 is located at a trough on the last wave of the sub-layer 110A. The reference point RP27 is located at a peak on an interface between the sub-layers 110A and 110B, and the reference point RP28 is located at a peak on an interface between the sub-layers 110B and 110C.

In the present embodiment, the spacings among the adjacent peaks of the oscillating function change from narrow to wide and then change from wide to narrow with respect to the reference point RP28 within the buffer layer 110. More specifically, an oscillation rate between reference points RP29 and RP30 within the buffer layer 110 is less than that within the rest of within the buffer layer 110 (i.e., the interval in front of the reference point RP29 and the interval behind the reference point RP30).

Accordingly, with respect to the reference point RP28, the oscillation rate in the concentration of the aluminum per unit thickness of the buffer layer 110 decreases from the reference point RP29, and then increases from the reference point RP30. For example, the oscillation rate in the concentration of the aluminum per unit thickness of the buffer layer 110 can include sub-oscillation rates R1, R2, and R3 in sequence with respect to the reference point RP25 within the buffer layer 110, and R1=R3>R2.

The reason for such formation of the buffer layer 110 is to maintain the desired thickness of the buffer layer 110. For example, during the formation of the buffer layer 110 which is set to have more than six periodic waves, when the stage of the formation of the sub-layer 110A goes at reference point RP29 and it is found the rest of the buffer layer 110 may have the enough thickness to contain the follow-up periodic waves with the low oscillation rate, the oscillation rate can be decreased at the reference point RP29 such that the growth of the buffer layer 110 can be continued with the low oscillation rate, which will make the growth quality of the buffer layer 110 improved. Then, when the stage of the formation of the sub-layer 110A goes at reference point RP30 and it is found the rest of the buffer layer 110 does not have the enough thickness to contain two periodic waves with the low oscillation rate, the oscillation rate can be increased at the reference point RP30 such that the growth of the buffer layer 110 can be continued with the high oscillation rate, which will make the buffer layer 110 comply the layer design. As a result, the buffer layer 110 can be formed with matching the desired thickness, and the periodic waves of the concentration of aluminum can avoid accumulation of stress during the formation.

Furthermore, in the sub-layer 110A, 110B, or 110C, all of the peaks of the oscillating function can correspond to the same value of the concentration of aluminum. In the sub-layer 110A, 110B, or 110C, all of the troughs of the oscillating function can correspond to the same value of the concentration of aluminum. Such configuration is made to simplify the formation of the buffer layer 110.

Figure 15:
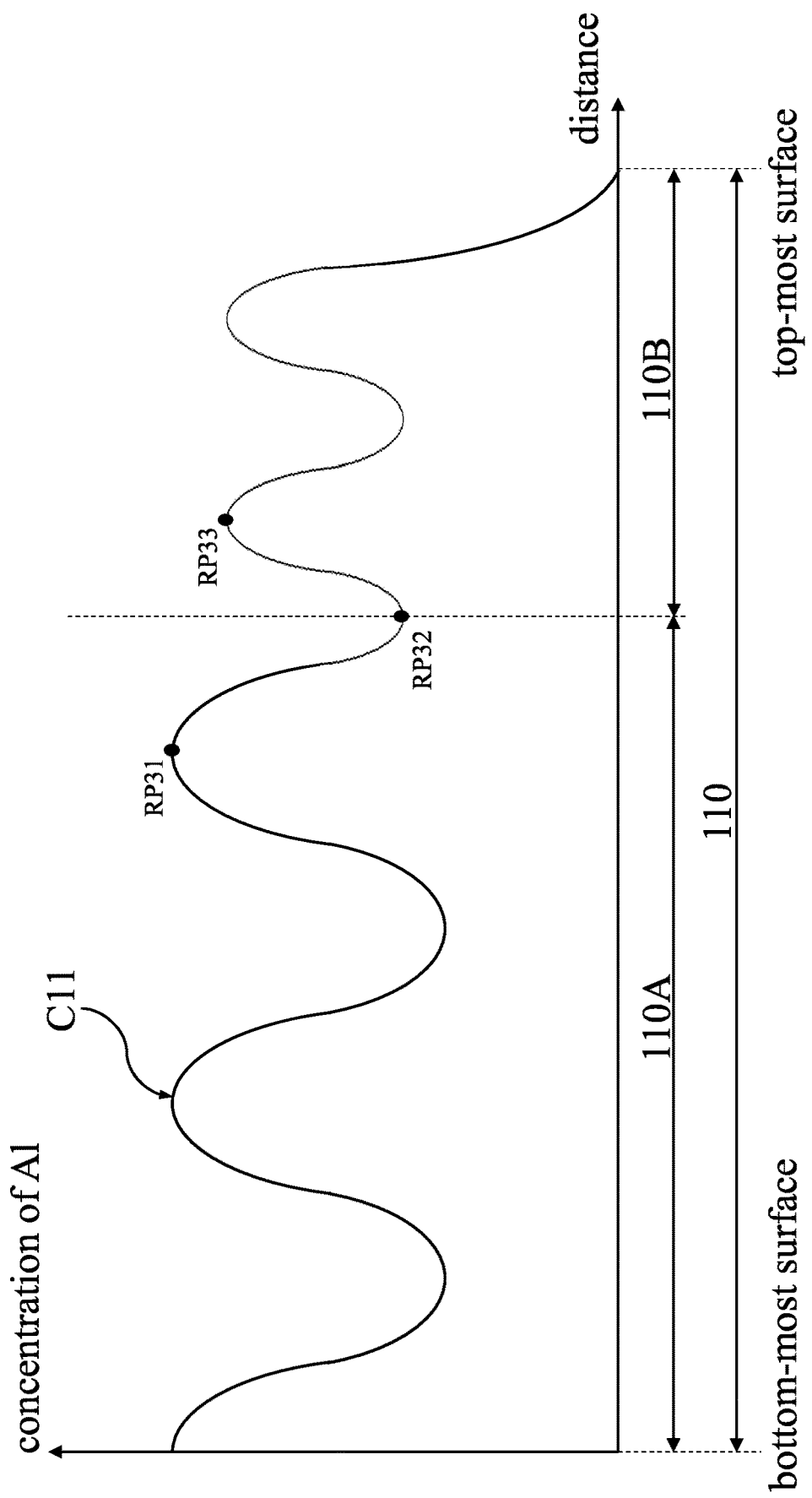
FIG. 15 is a graph showing a variable concentration of aluminum in a buffer layer versus a distance within a thickness of the same according to some embodiments of the present disclosure.

FIG. 15 is a graph showing a variable concentration of aluminum in a buffer layer 110 versus a distance within a thickness of the same according to some embodiments of the present disclosure, the buffer layer 110 can have three sub-layers 110A and 110B. The sub-layers 110A and 110B are stacked sequentially. As shown in FIG. 15, the buffer layer 110 has a concentration of aluminum oscillating within the buffer layer 110, such that the concentration of aluminum can vary as an oscillating function of a distance within a thickness of the buffer layer 110. The relationship curve C11 is made with labeled by reference points RP31, RP32, and RP33 for convenient reference. As viewed in the oscillating function, the reference point RP31 is located at a peak on the last wave of the sub-layer 110A. The reference point RP32 is located at a trough on an interface between the sub-layers 110A and 110B. The reference point RP33 is located at a peak on the first wave of the sub-layer 110B.

In the present embodiment, the spacings among the adjacent peaks of the oscillating function change from wide to narrow with respect to the reference point RP31 within the buffer layer 110. More specifically, with respect to the reference point RP31, the oscillation rate in the concentration of the aluminum per unit thickness of the buffer layer 110 decreases from the reference point RP32. In some embodiments, a periodic curve in front of the reference point RP32 has an oscillation rate less than that of a periodic curve behind the reference point RP32. Correspondingly, these two periodic curves have different frequencies/wavelengths. In addition to the change of the oscillation rate, the amplitude of the oscillating function varies as well. For example, a periodic curve in front of the reference point RP32 has an amplitude greater than that of the periodic curve behind reference point RP32.

As afore-described, such formation of the buffer layer 110 can have the desired thickness of the buffer layer 110 maintained, which achieves by adjusting the oscillation rate. Moreover, since a layer to be formed on the buffer layer 110 is devoid of aluminum, the concentration of aluminum in the buffer layer 110 need to be decreased. As two kinds of the periodic curves have significantly different amplitudes with decreasing which are made for complying a layer to be formed on the buffer layer 110. Such formation can have the process for forming the buffer layer 110 simplified.

Figure 16:
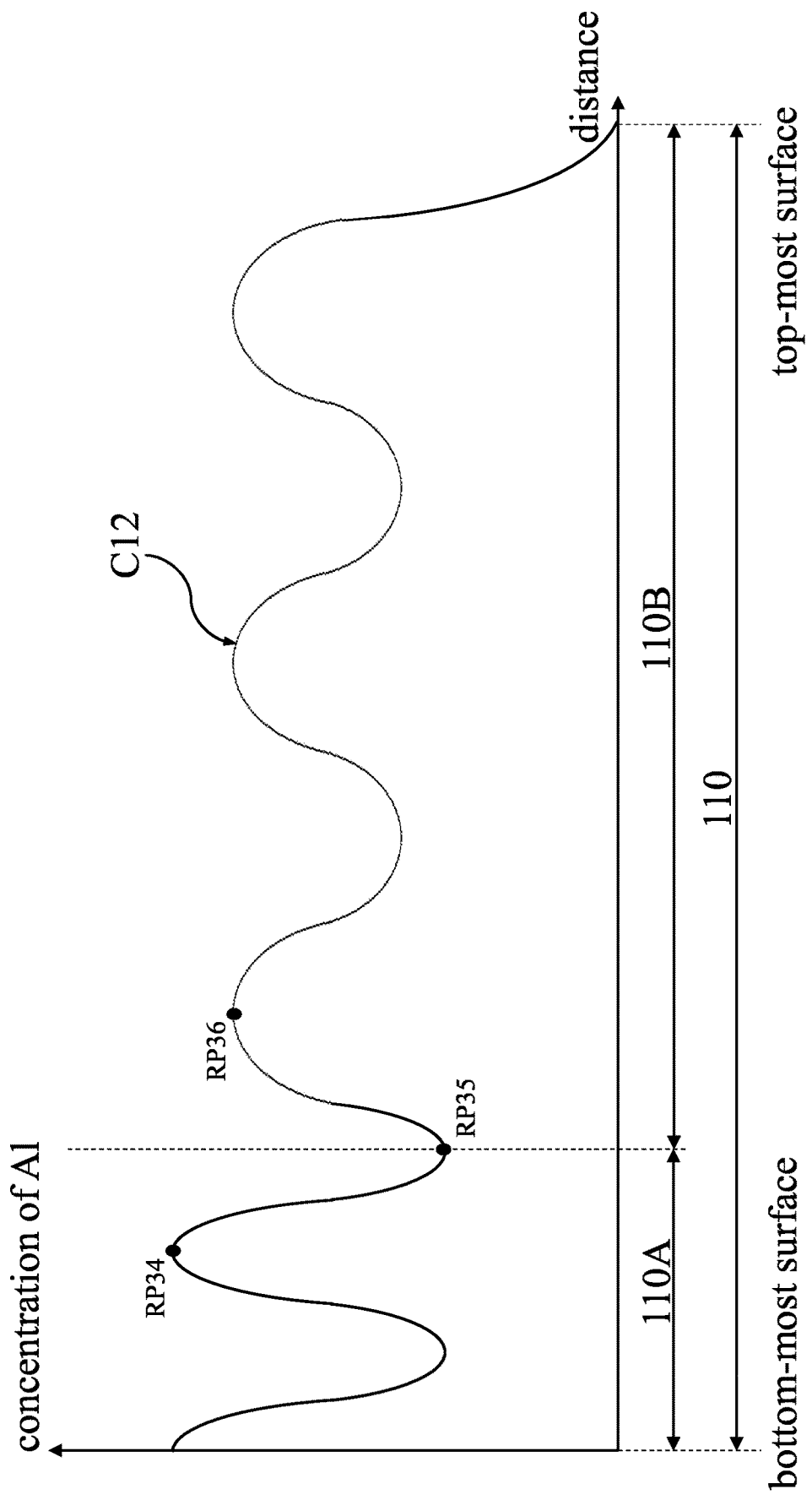
FIG. 16 is a graph showing a variable concentration of aluminum in a buffer layer 110 versus a distance within a thickness of the same according to some embodiments of the present disclosure.

FIG. 16 is a graph showing a variable concentration of aluminum in a buffer layer 110 versus a distance within a thickness of the same according to some embodiments of the present disclosure, the buffer layer 110 can have three sub-layers 110A and 110B. The sub-layers 110A and 110B are stacked sequentially. As shown in FIG. 16, the buffer layer 110 has a concentration of aluminum oscillating within the buffer layer 110, such that the concentration of aluminum can vary as an oscillating function of a distance within a thickness of the buffer layer 110. The relationship curve C11 is made with labeled by reference points RP34, RP35, and RP36 for convenient reference. As viewed in the oscillating function, the reference point RP34 is located at a peak on the last wave of the sub-layer 110A. The reference point RP35 is located at a trough on an interface between the sub-layers 110A and 110B. The reference point RP36 is located at a peak on the first wave of the sub-layer 110B.

In the present embodiment, the spacings among the adjacent peaks of the oscillating function change from narrow to wide with respect to the reference point RP34 within the buffer layer 110. More specifically, with respect to the reference point RP34, the oscillation rate in the concentration of the aluminum per unit thickness of the buffer layer 110 increases from the reference point RP35. In some embodiments, a periodic curve in front of the reference point RP35 has an oscillation rate less than that of a periodic curve behind the reference point RP35. Correspondingly, these two periodic curves have different frequencies/wavelengths. In addition to the change of the oscillation rate, the amplitude of the oscillating function varies as well. For example, a periodic curve in front of the reference point RP35 has an amplitude greater than that of the periodic curve behind reference point RP35.

As afore-described, such formation of the buffer layer 110 can have the desired thickness of the buffer layer 110 maintained, which achieves by adjusting the oscillation rate. Furthermore, the formation of the buffer layer 110 following the reference point RP35 can have the growth quality improved due to the slower oscillation rate. Similarly, as two kinds of the periodic curves have significantly different amplitudes with decreasing, the formation can have the process for forming the buffer layer 110 simplified.

Figure 17:
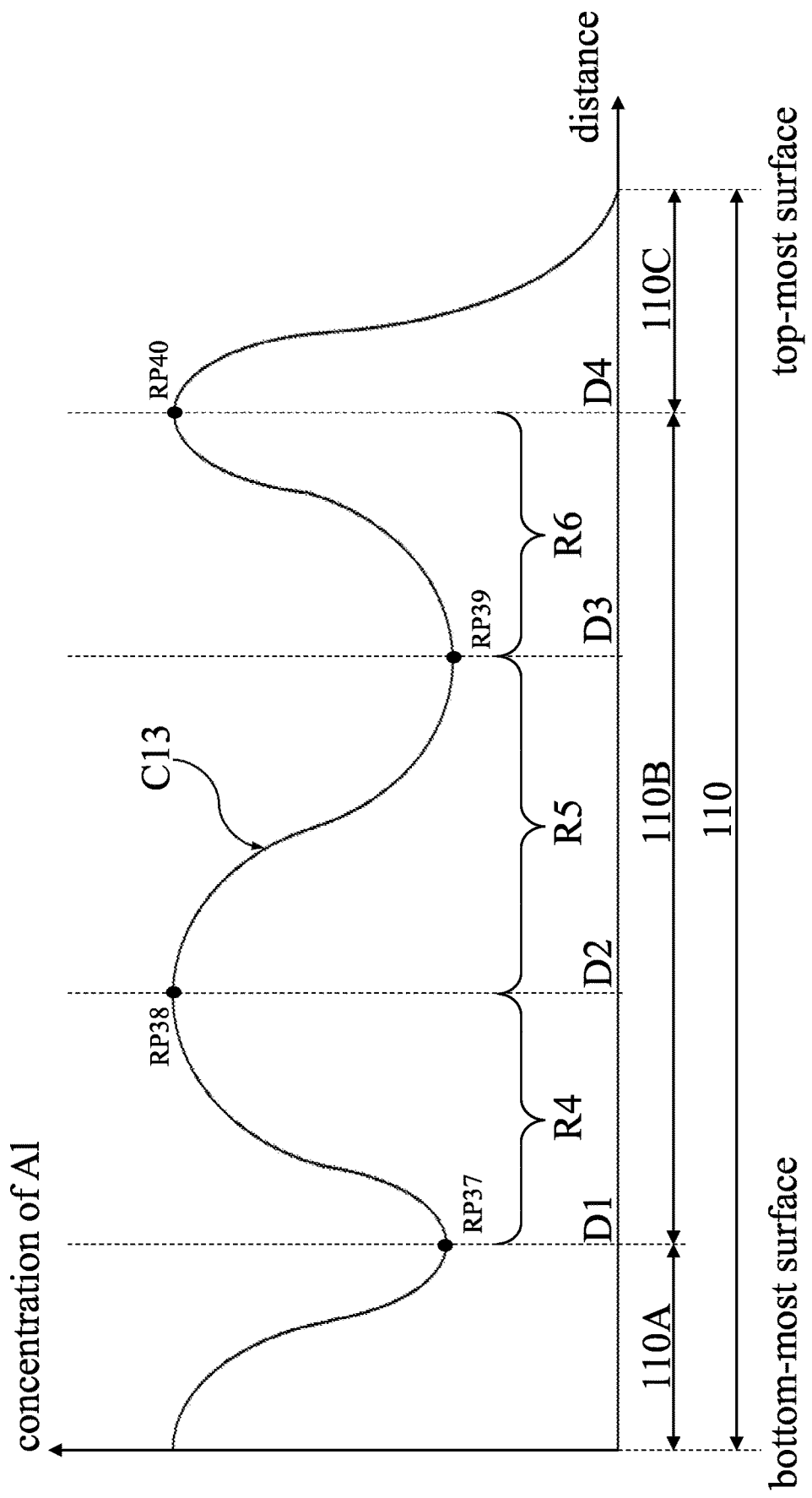
FIG. 17 is a graph showing a variable concentration of aluminum in a buffer layer versus a distance within a thickness of the same according to some embodiments of the present disclosure.

FIG. 17 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 17, the buffer layer 110 has a concentration of aluminum oscillating within the buffer layer 110, such that the concentration of aluminum can vary as an oscillating function of a distance within a thickness of the buffer layer 110. The relationship curve C13 is made with labeled by reference points RP37, RP38, RP39, and RP40 for convenient reference. As viewed in the oscillating function, the reference point RP37 is located at a trough on an interface between the sub-layers 110A and 110B. The reference point RP38 is located at a peak on the first wave of the sub-layer 110B. The reference point RP39 is located at a trough on the last wave of the sub-layer 110B. The reference point RP40 is located at a peak on an interface between the sub-layers 110B and 110C. The reference points RP37, RP38, RP39, and RP40 are respectively positioned at distances D1, D2, D3, and D4 from the bottom-most surface of the buffer layer 110 (i.e., a top surface of a nucleation layer). The relationship among the distances D1-D4 is that D1<D2<D3<D4.

In the present embodiment, an oscillation rate in a concentration of aluminum per unit thickness of the buffer layer 110 can continuously vary. More specifically, an oscillation rate in front the reference point RP37 is greater than an average oscillation rate between the reference points RP37 and RP40; and the average oscillation rate between the reference points RP37 and RP40 is less than an oscillation rate behind the reference point RP40. In the interval between the reference points RP37 and RP40, the oscillation rate continuously varies. For example, the oscillation rate in this interval includes a sub-oscillation rate R4 between the reference points RP37 and RP38, a sub-oscillation rate R5 between the reference points RP38 and RP39, and a sub-oscillation rate R6 between the reference points RP39 and RP40. On the averages, R4>R5 and R6>R5. The sub-oscillation rate R4 can get decreased from the reference point RP37 to the reference point RP38. The sub-oscillation rate R5 can get kept substantially steady from the reference point RP38 to the reference point RP39. The sub-oscillation rate R6 can get increased from the reference point RP39 to the reference point RP40. According to such configuration, a difference between the distances D1 and D2 can be less than a difference between the distances D2 and D3. Also, the difference between the distances D2 and D3 can be greater than a difference between the distances D3 and D4. It means the oscillation rate in the concentration of aluminum per unit thickness of the buffer layer 110 can vary as being distance-dependent, so as to fit the different designs/requirements in the formation of the buffer layer 110 under unavoidable process limitation.

Furthermore, the different peaks/troughs can be designed as being the same or different values of the concentration of aluminum. In some embodiments, the reference points RP37 and RP39 can correspond to the same value of the concentration of aluminum. In some embodiments, the reference point RP37 can correspond to a value of the concentration of aluminum less than a value of the concentration of aluminum that the reference point RP39 corresponds to. Similarly, in some embodiments, the reference points RP38 and RP40 can correspond to the same value of the concentration of aluminum. In some embodiments, the reference point RP38 can correspond to a value of the concentration of aluminum greater than a value of the concentration of aluminum that the reference point RP40 corresponds to.

Figure 18:
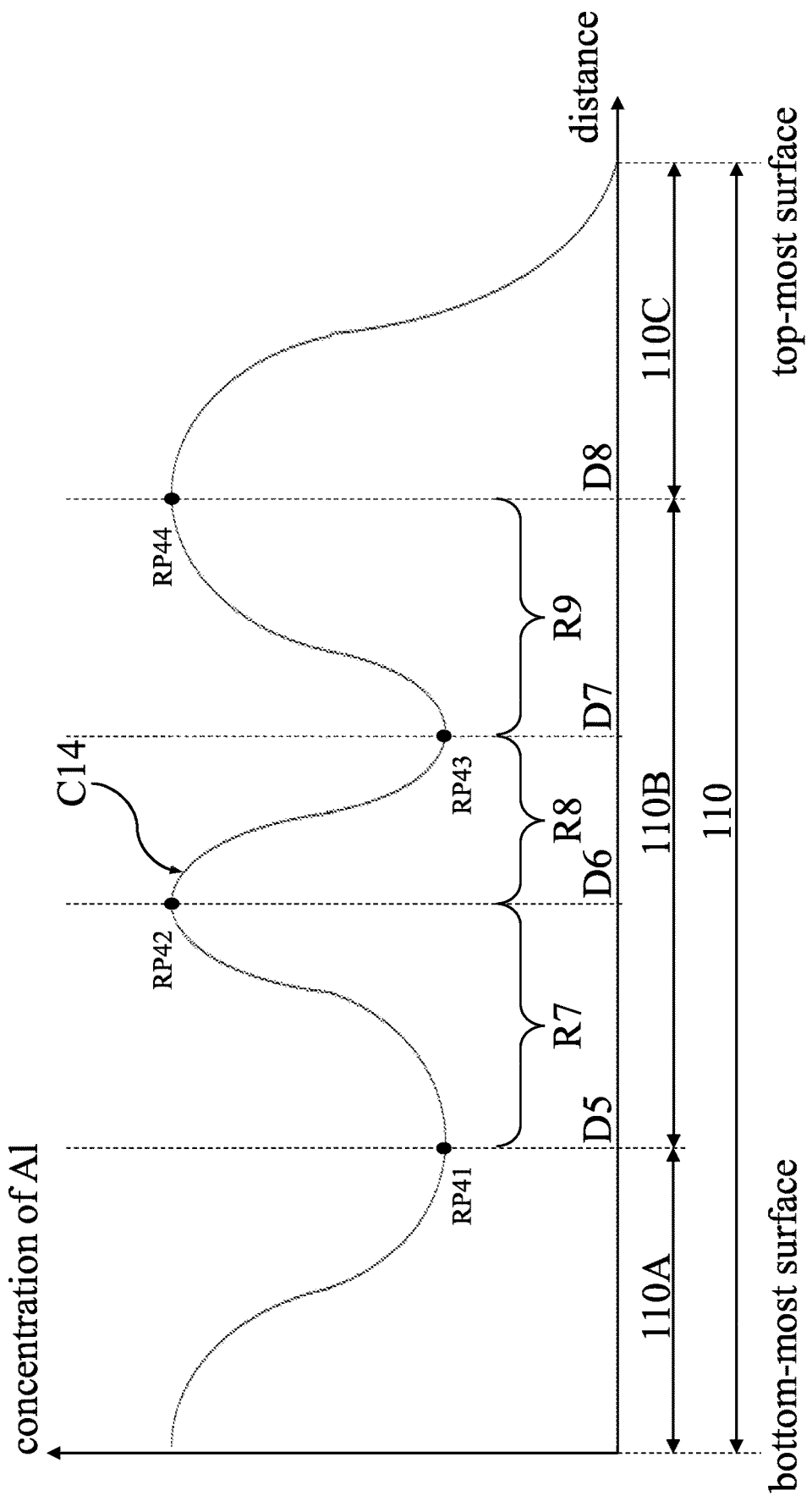
FIG. 18 is a graph showing a variable concentration of aluminum in a buffer layer versus a distance within a thickness of the same according to some embodiments of the present disclosure.

FIG. 18 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 18, the buffer layer 110 has a concentration of aluminum oscillating within the buffer layer 110, such that the concentration of aluminum can vary as an oscillating function of a distance within a thickness of the buffer layer 110. The relationship curve C14 is made with labeled by reference points RP41, RP42, RP43, and RP44 for convenient reference. As viewed in the oscillating function, the reference point RP41 is located at a trough on an interface between the sub-layers 110A and 110B. The reference point RP42 is located at a peak on the first wave of the sub-layer 110B. The reference point RP43 is located at a trough on the last wave of the sub-layer 110B. The reference point RP44 is located at a peak on an interface between the sub-layers 110B and 110C. The reference points RP41, RP42, RP43, and RP44 are respectively positioned at distances D5, D6, D7, and D8 from the bottom-most surface of the buffer layer 110 (i.e., a top surface of a nucleation layer). The relationship among the distances D5-D8 is that D5<D6<D7<D8.

In the present embodiment, an oscillation rate in a concentration of aluminum per unit thickness of the buffer layer 110 can continuously vary. Similarly, an oscillation rate in front the reference point RP41 is less than an average oscillation rate between the reference points RP41 and RP44; and the average oscillation rate between the reference points RP41 and RP44 is greater than an oscillation rate behind the reference point RP44. In the interval between the reference points RP41 and RP44, the oscillation rate continuously varies. For example, the oscillation rate in this interval includes a sub-oscillation rate R7 between the reference points RP41 and RP42, a sub-oscillation rate R8 between the reference points RP42 and RP43, and a sub-oscillation rate R9 between the reference points RP43 and RP44. On the averages, R8>R7 and R8>R9. The sub-oscillation rate R7 can get increased from the reference point RP41 to the reference point RP42. The sub-oscillation rate R8 can get kept substantially steady from the reference point RP42 to the reference point RP43. The sub-oscillation rate R9 can get decreased from the reference point RP43 to the reference point RP44. According to such configuration, a difference between the distances D5 and D6 can be greater than a difference between the distances D6 and D7. Also, the difference between the distances D6 and D7 can be less than a difference between the distances D7 and D8. It means the oscillation rate in the concentration of aluminum per unit thickness of the buffer layer 110 can vary as being distance-dependent, so as to fit the different designs/requirements in the formation of the buffer layer 110 under unavoidable process limitation.

Furthermore, the different peaks/troughs can be designed as being the same or different values of the concentration of aluminum. In some embodiments, the reference points RP41 and RP43 can correspond to the same value of the concentration of aluminum. In some embodiments, the reference point RP41 can correspond to a value of the concentration of aluminum less than a value of the concentration of aluminum that the reference point RP43 corresponds to. Similarly, in some embodiments, the reference points RP42 and RP44 can correspond to the same value of the concentration of aluminum. In some embodiments, the reference point RP42 can correspond to a value of the concentration of aluminum greater than a value of the concentration of aluminum that the reference point RP44 corresponds to.

For example, during the formation of the buffer layer 110 which is set to have more than six periodic waves, when the stage of the formation of the sub-layer 110A goes at reference point RP29 and it is found the rest of the buffer layer 110 may have the enough thickness to contain the follow-up periodic waves with the low oscillation rate, the oscillation rate can be decreased at the reference point RP29 such that the growth of the buffer layer 110 can be continued with the low oscillation rate, which will make the growth quality of the buffer layer 110 improved. Then, when the stage of the formation of the sub-layer 110A goes at reference point RP30 and it is found the rest of the buffer layer 110 does not have the enough thickness to contain two periodic waves with the low oscillation rate, the oscillation rate can be increased at the reference point RP30 such that the growth of the buffer layer 110 can be continued with the high oscillation rate, which will make the buffer layer 110 comply the layer design. As a result, the buffer layer 110 can be formed with matching the desired thickness, and the periodic waves of the concentration of aluminum can avoid accumulation of stress during the formation.

Furthermore, in the sub-layer 110A, 110B, or 110C, all of the peaks of the oscillating function can correspond to the same value of the concentration of aluminum. In the sub-layer 110A, 110B, or 110C, all of the troughs of the oscillating function can correspond to the same value of the concentration of aluminum. Such configuration is made to simplify the formation of the buffer layer 110.

Figure 19:
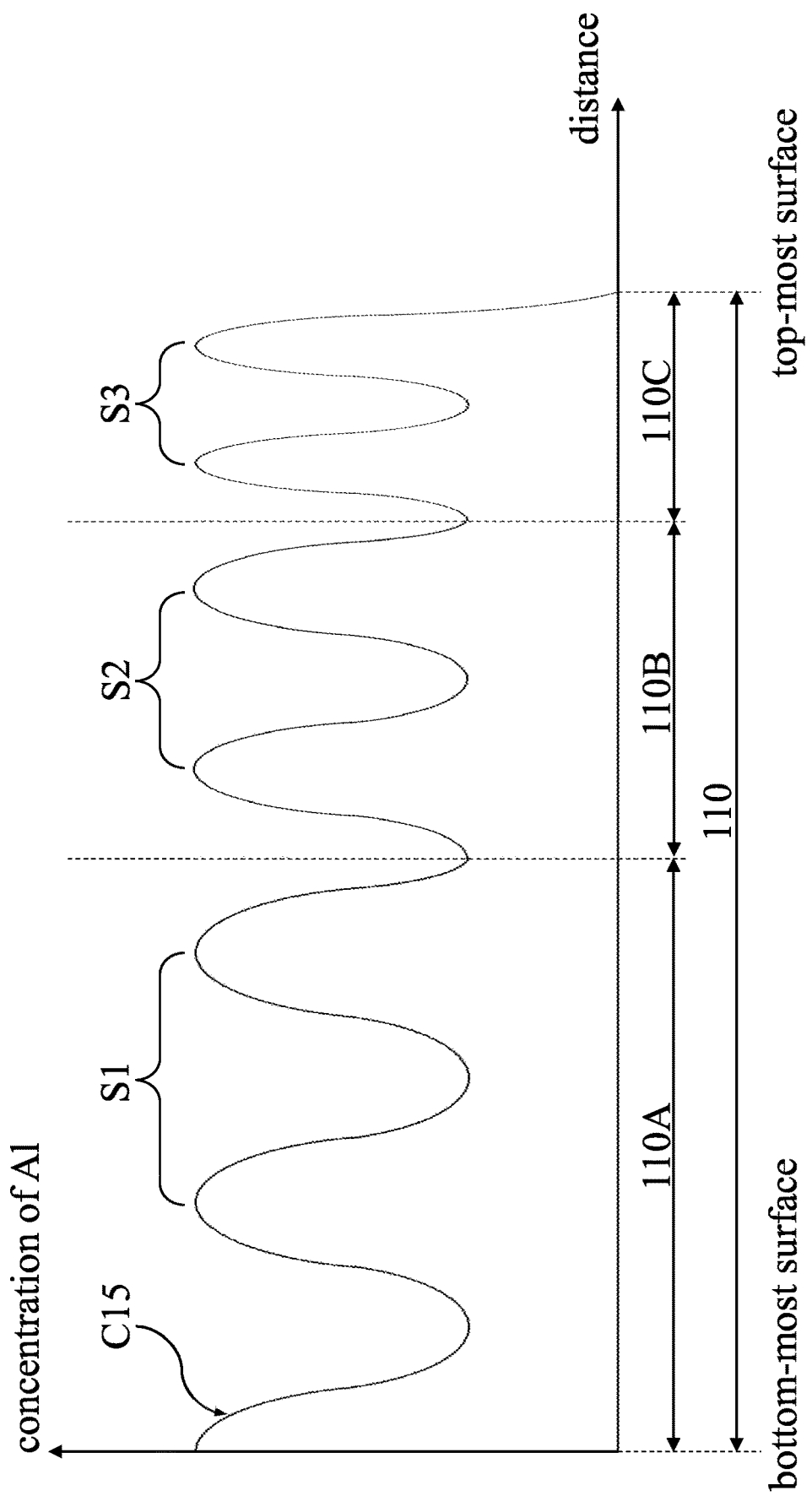
FIG. 19 is a graph showing a variable concentration of aluminum in a buffer layer versus a distance within a thickness of the same according to some embodiments of the present disclosure.

FIG. 19 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 19, the buffer layer 110 has a concentration of aluminum oscillating within the buffer layer 110, such that the concentration of aluminum can vary as an oscillating function of a distance within a thickness of the buffer layer 110, as expressed by a relationship curve C15.

In the present embodiment, a spacing S1 is between the adjacent peaks within the sub-layer 110A; a spacing S2 is between the adjacent peaks within the sub-layer 110B; and a spacing S3 is between the adjacent peaks within the sub-layer 110C. The spacings S1, S2, and S3 are arranged in sequence with respect to the beginning point within the buffer layer 110, and S1>S2>S3.

Figure 20:
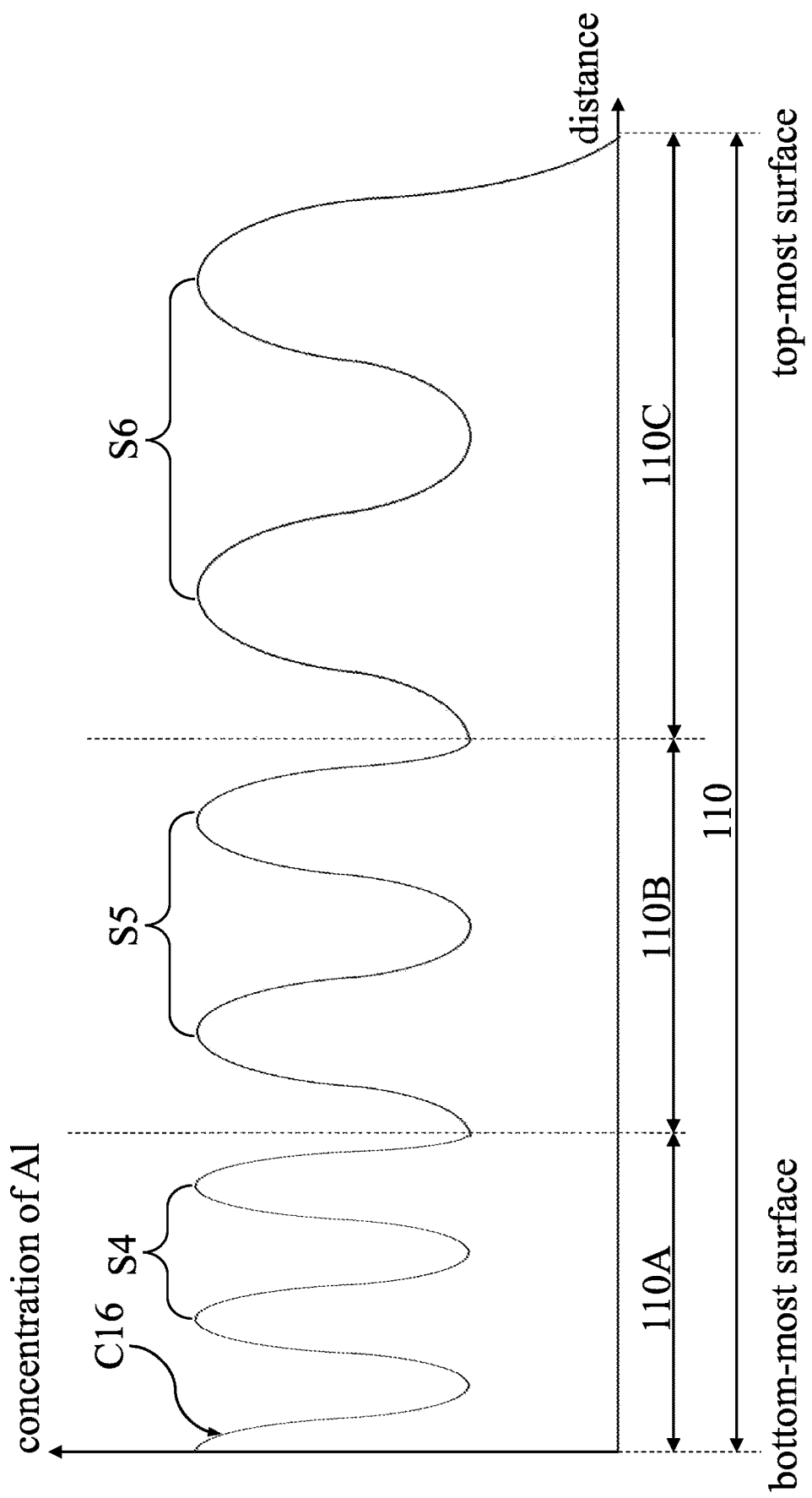
FIG. 20 is a graph showing a variable concentration of aluminum in a buffer layer versus a distance within a thickness of the same according to some embodiments of the present disclosure.

FIG. 20 is a graph showing a variable concentration of aluminum in a buffer layer 110 versus a distance within a thickness of the same according to some embodiments of the present disclosure, the buffer layer 110 can have three sub-layers 110A, 110B, and 110C. The sub-layers 110A-110C are stacked sequentially. As shown in FIG. 20, the buffer layer 110 has a concentration of aluminum oscillating within the buffer layer 110, such that the concentration of aluminum can vary as an oscillating function of a distance within a thickness of the buffer layer 110, as expressed by a relationship curve C16.

In the present embodiment, a spacing S4 is between the adjacent peaks within the sub-layer 110A; a spacing S5 is between the adjacent peaks within the sub-layer 110B; and a spacing S6 is between the adjacent peaks within the sub-layer 110C. The spacings S4, S5, and S6 are arranged in sequence with respect to the beginning point within the buffer layer 110, and S4<S5<S6.

Figure 21A:
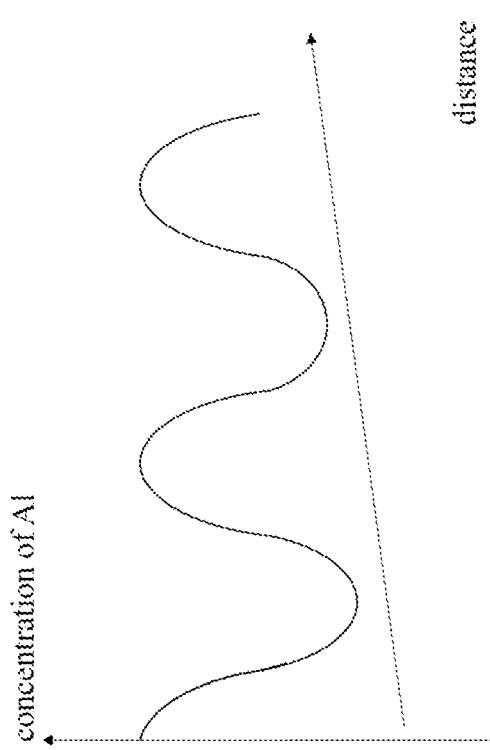
FIGS. 21A-21H depict graphs showing variable concentration of aluminum in a buffer layer versus a distance within a thickness of the same according to some embodiments of the present disclosure.
Figure 21B:
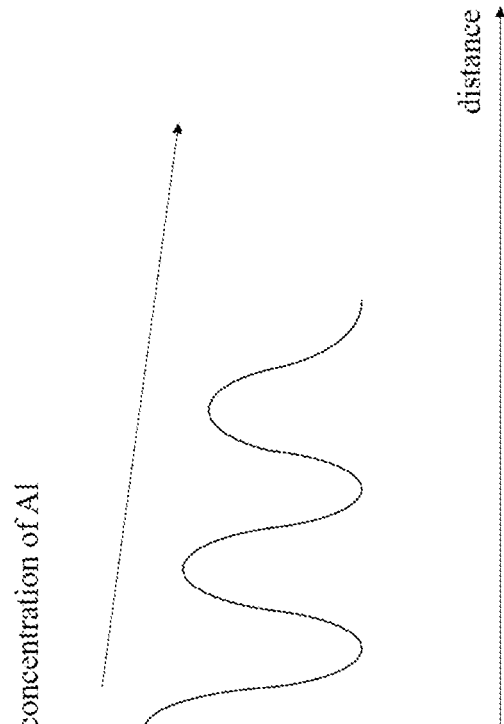
Figure 21C:
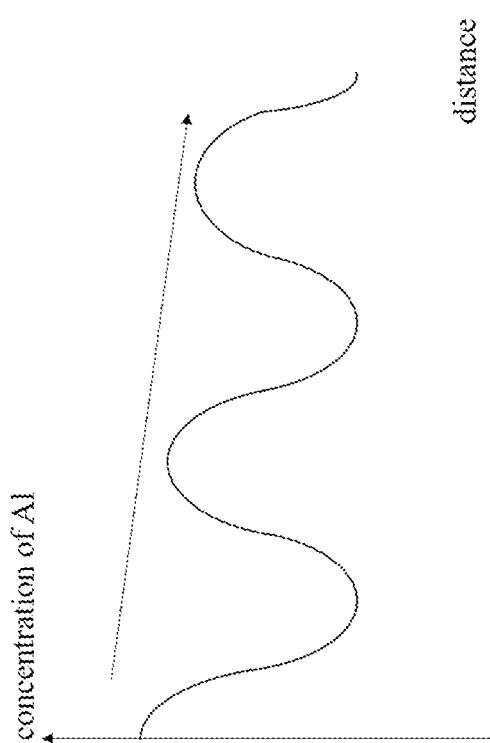
Figure 21D:
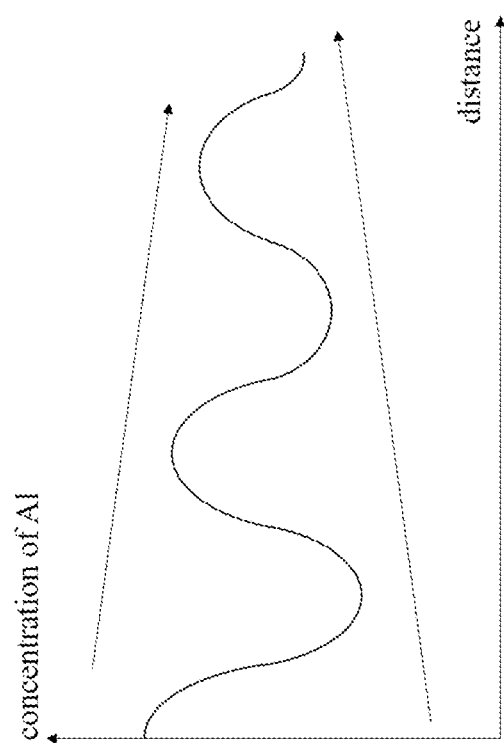
Figure 21E:
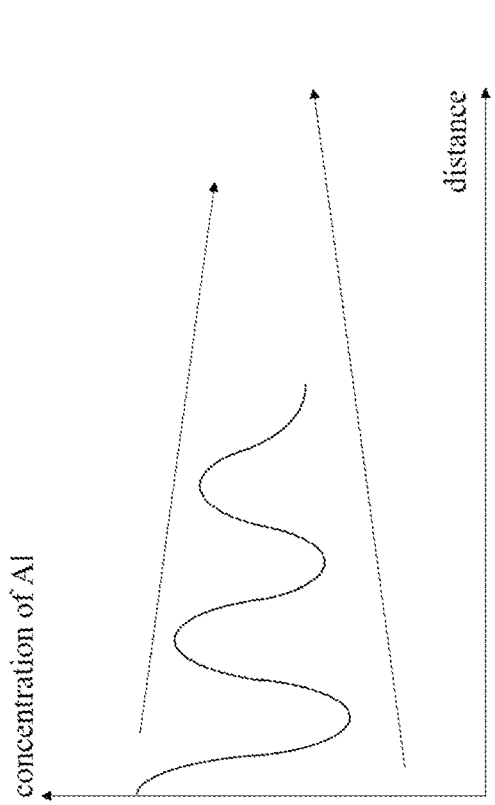
Figure 21G:
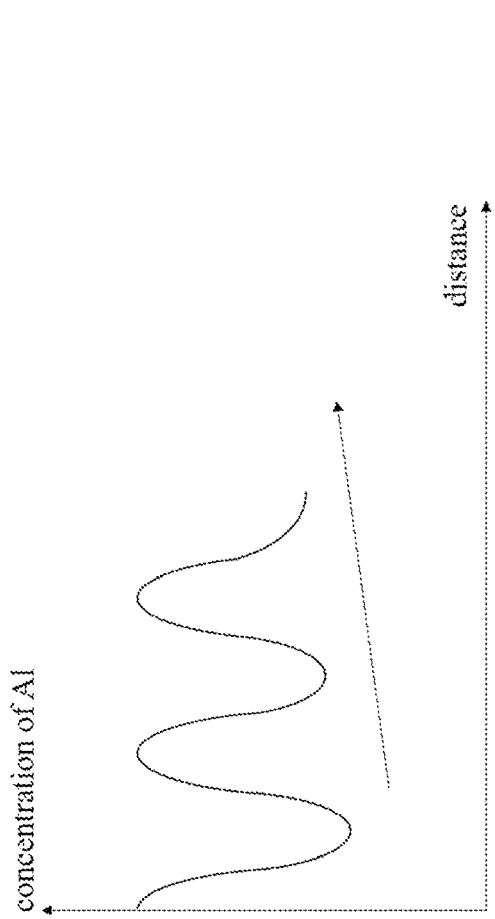
Figure 21F:
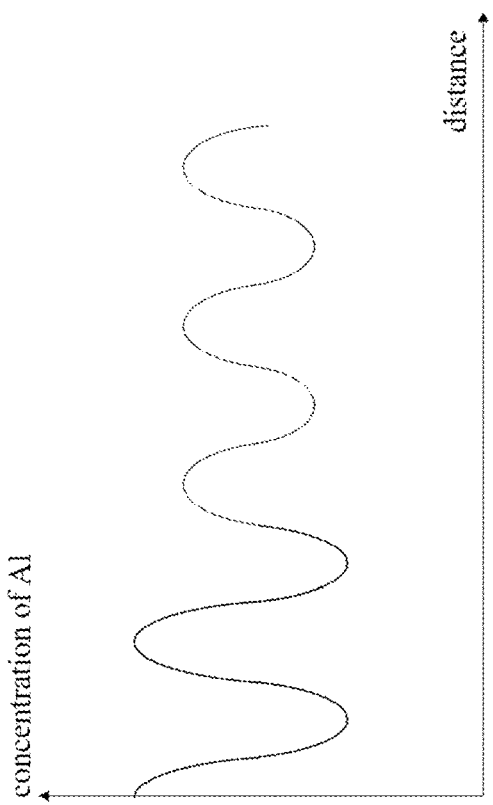
Figure 21H:
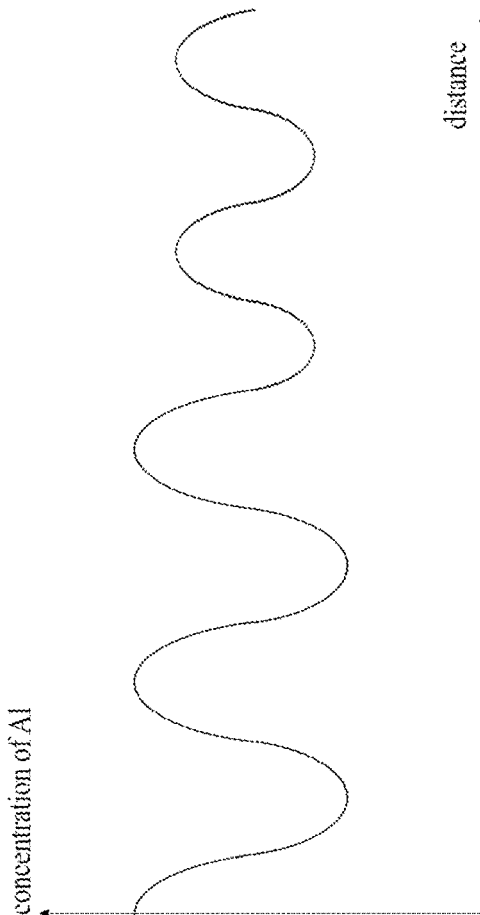

Although the embodiments above focus on a combination of high and low oscillation rates, only high or low oscillation rate is available. For example, FIGS. 21A-21H depict graphs showing variable concentration of aluminum in a buffer layer versus a distance within a thickness of the same according to some embodiments of the present disclosure, and each concentration of aluminum of these illustrations has single oscillation rate. FIG. 21A shows only low oscillation rate with decreasing the amplitude (i.e., the peaks decrease); FIG. 21B shows only low oscillation rate with decreasing the amplitude (i.e., the troughs increase); FIG. 21C shows only low oscillation rate with decreasing the amplitude (i.e., the peaks decrease and the troughs increase); FIG. 21D shows only high oscillation rate with decreasing the amplitude (i.e., the peaks decrease); FIG. 21E shows only high oscillation rate with decreasing the amplitude (i.e., the troughs increase); FIG. 21F shows only high oscillation rate with decreasing the amplitude (i.e., the peaks decrease and the troughs increase); FIG. 21G shows only low oscillation rate with decreasing the amplitude (i.e., the waveform got smaller); and FIG. 21H shows only high oscillation rate with decreasing the amplitude (i.e., the waveform got smaller).

According to the embodiments above, multiple solutions for improving the accumulation of the stress during the formation of the buffer layer are provided, which means the process for manufacturing a semiconductor device applying such concept is flexible and thus can be generally applied. The embodiments above can be applied to different situations, to make the buffer layer comply with the design. Therefore, those different solutions can be selected/chosen according to the conditions/requirements/demands of the manufacturing process.

Furthermore, the graphs involving the wave functions as stated above are illustrated for the exemplary purpose, and the present disclosure is not limited by them. Modification to them is possible and available. For example, increasing or decreasing the number of the cycles in the wave function is available. Modification to them is still in the spirit of the present disclosure.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:
1. A semiconductor device, comprising:
a substrate;
a nucleation layer comprising a composition that includes a first element and disposed on and forming an interface with the substrate;
a buffer layer comprising a III-V compound which includes the first element, the buffer layer disposed on and forming an interface with the nucleation layer, wherein the buffer layer has a concentration of the first element oscillating within the buffer layer, such that the concentration of the first element varies as an oscillating function of a distance within a thickness of the buffer layer, wherein a first oscillation rate between a first reference point and a second reference point within the buffer layer is greater than a second oscillation rate between the second reference point and a third reference point within the buffer layer;
a first nitride-based semiconductor layer disposed on and forming an interface with the buffer layer, wherein the concentration of the first element within the buffer layer first oscillates with respect to the first reference point so that peaks and troughs of the concentration converge toward a positive steady value, and then the concentration drops to 0 at the interface between the buffer layer and the first nitride-based semiconductor layer;
a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region; and two or more source/drain (S/D) electrodes and a gate electrode disposed over the second nitride-based semiconductor layer, wherein the gate electrode is between the S/D electrodes.

2. The semiconductor device of claim 1, wherein the first, second, and third reference points are respectively positioned at first, second, and third distances from a top surface of the nucleation layer, and the second distance is between the first and third distances.

3. The semiconductor device of claim 2, wherein the second distance is greater than the first distance.

4. The semiconductor device of claim 2, wherein a difference between the first and second distances is less than a difference between the second and the third distances.

5. The semiconductor device of claim 2, wherein the first and third reference point are respectively located at adjacent troughs of the oscillating function, and the second reference point is located at a peak of the oscillating function.

6. The semiconductor device of claim 5, wherein the first and third reference points correspond to a same value of the concentration of the first element.

7. The semiconductor device of claim 5, wherein the first reference point corresponds to a value of the concentration of the first element less than a value of the concentration that the third reference point corresponds to.

8. The semiconductor device of claim 1, wherein a third oscillation rate between the third reference point and a fourth reference point within the buffer layer is greater than the second oscillation rate between the second reference point and the third reference point within the buffer layer.

9. The semiconductor device of claim 8, wherein the fourth reference point is positioned at a fourth distance from the top surface of the nucleation layer, and the third distance is between the second and fourth distances.

10. The semiconductor device of claim 9, wherein the fourth distance is greater than the third distance.

11. The semiconductor device of claim 9, wherein the difference between the second and the third distances is greater than a difference between the third and the fourth distances.

12. The semiconductor device of claim 9, wherein the fourth reference point is located at a peak of the oscillating function adjacent with the second reference point.

13. The semiconductor device of claim 12, wherein the second and fourth reference points correspond to a same value of the concentration of the first element.

14. The semiconductor device of claim 12, wherein the second reference point corresponds to a value of the concentration of the first element greater than a value of the concentration that the fourth reference point corresponds to.

15. The semiconductor device of claim 1, wherein the concentration of the first element at a beginning point of the oscillating function is greater than the concentration of the first element at an end point of the oscillating function.

16. The semiconductor device of claim 1, wherein the oscillating function is a wave function having a plurality of waves, and wavelengths of the waves vary as the concentration of the first element oscillates within the buffer layer.

17. The semiconductor device of claim 1, wherein the buffer layer has a thickness in a range from 1 μm to about 50 μm.

18. The semiconductor device of claim 1, wherein the first element is aluminum, and the first nitride-based semiconductor layer is devoid of aluminum.

19. The semiconductor device of claim 1, wherein the first element is aluminum, the nucleation layer comprises aluminum nitride (AlN), the buffer layer comprises aluminum gallium nitride (AlGaN), and the first nitride-based semiconductor layer comprises gallium nitride (GaN).

20. The semiconductor device of claim 1, wherein the buffer layer further comprises indium.

* * * * *